(12) United States Patent
Watanabe et al.

(10) Patent No.: US 8,507,377 B2
(45) Date of Patent: Aug. 13, 2013

(54) SEMICONDUCTOR DEVICE, METHOD OF MANUFACTURING THE SAME, AND PHASE SHIFT MASK

(75) Inventors: Kenichi Watanabe, Kawasaki (JP); Michiari Kawano, Kawasaki (JP); Hiroshi Namba, Kawasaki (JP); Kazuo Sukegawa, Kawasaki (JP); Takumi Hasegawa, Kawasaki (JP); Toyoji Sawada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/764,210

(22) Filed: Apr. 21, 2010

(65) Prior Publication Data

US 2010/0240211 A1    Sep. 23, 2010

Related U.S. Application Data

(62) Division of application No. 12/357,919, filed on Jan. 22, 2009, now Pat. No. 7,755,169, which is a division of application No. 11/352,273, filed on Feb. 13, 2006, now Pat. No. 7,498,659, which is a division of application No. 10/349,934, filed on Jan. 24, 2003, now Pat. No. 7,129,565.

(30) Foreign Application Priority Data

Mar. 15, 2002   (JP) .................................. 2002-072737
Sep. 30, 2002   (JP) .................................. 2002-286687

(51) Int. Cl.
*H01L 21/4763*   (2006.01)

(52) U.S. Cl.
USPC ..... 438/622; 257/620; 257/758; 257/E23.153

(58) Field of Classification Search
USPC .................. 438/622; 257/758, 620, E23.153
See application file for complete search history.

(56) References Cited

U.S. PATENT DOCUMENTS 4,591,945 A    5/1986  Ugon
5,834,829 A   11/1998  Dinkel et al.
(Continued)

FOREIGN PATENT DOCUMENTS

CN    1325545 A    12/2001
EP    0 707 341 A1   4/1996
(Continued)

OTHER PUBLICATIONS

Office Action from Patent Office of China from corresponding Chinese application dated Jul. 8, 2003.
(Continued)

*Primary Examiner* — Phat X Cao
(74) *Attorney, Agent, or Firm* — Westerman, Hattori, Daniels & Adrian, LLP

(57) ABSTRACT

A method of manufacturing a semiconductor device including an integrated circuit part in which an integrated circuit is formed and a main wall part including metal films surrounding said integrated circuit part, includes the step of selectively forming a sub-wall part including metal films between the integrated circuit part and the main wall part, in parallel to formation of the integrated circuit part and the main wall part. A sub-wall part which is in an "L" shape is provided between each corner of the main wall part and the integrated circuit part of the resulting semiconductor device.

8 Claims, 37 Drawing Sheets

(56) References Cited

U.S. PATENT DOCUMENTS

| | | | |
|---|---|---|---|
| 5,846,874 | A | 12/1998 | Hartranft et al. |
| 5,858,580 | A | 1/1999 | Wang et al. |
| 5,879,839 | A | 3/1999 | Jung et al. |
| 5,883,001 | A | 3/1999 | Jin et al. |
| 6,022,791 | A | 2/2000 | Cook et al. |
| 6,028,347 | A | 2/2000 | Sauber et al. |
| 6,043,551 | A | 3/2000 | Seshan |
| 6,207,333 | B1 | 3/2001 | Adair et al. |
| 6,335,128 | B1 | 1/2002 | Cobb et al. |
| 6,365,958 | B1 | 4/2002 | Ibnabdeljalil et al. |
| 6,570,243 | B1 | 5/2003 | Hagihara |
| 7,129,565 | B2 | 10/2006 | Watanabe et al. |
| 2002/0024115 | A1 | 2/2002 | Ibnabdeljalil et al. |
| 2002/0125577 | A1* | 9/2002 | Komada .................. 257/774 |
| 2002/0175415 | A1* | 11/2002 | Matsunaga ............... 257/758 |
| 2003/0155642 | A1 | 8/2003 | Davis et al. |

FOREIGN PATENT DOCUMENTS

| | | |
|---|---|---|
| JP | 63-232447 | 9/1988 |
| JP | 9-179287 A | 7/1997 |
| JP | 10-98014 | 4/1998 |
| JP | 2001-168093 A | 6/2001 |
| JP | 2001-274338 A | 10/2001 |
| KR | 1998-024381 A | 7/1998 |
| WO | 98/02782 A1 | 1/1998 |
| WO | 0014801 A1 | 3/2000 |
| WO | 02-21594 A2 | 3/2002 |

OTHER PUBLICATIONS

European Search Report and Annex dated Nov. 16, 2004 (Search dated Nov. 5, 2004).
Korean Office Action dated Feb. 20, 2008 of the corresponding Korean application No. 10-2003-15970.
European Search Report for corresponding application No. EP 03003482.1.
Wolf et al., Silicon Processing for the VLSI Era, 2000, vol. I, Lattice Press, 719-720, 779-782.
Extended European Search Report dated Dec. 7, 2012, issued in corresponding European patent application No. 12173143.4.

* cited by examiner

SEMICONDUCTOR DEVICE, METHOD OF MANUFACTURING THE SAME, AND PHASE SHIFT MASK

CROSS-REFERENCE TO RELATED APPLICATIONS

This application is a divisional application of Ser. No. 12/357,919, filed Jan. 22, 2009, which is a divisional application of Ser. No. 11/352,273, filed Feb. 13, 2006 and issued as U.S. Pat. No. 7,498,659, which is a divisional application of Ser. No. 10/349,934, filed Jan. 24, 2003 and issued as U.S. Pat. No. 7,129,565, which is based on and claims the priority of Japanese Patent Application No. 2002-072737, filed on Mar. 15, 2002 and Japanese Patent Application No. 2002-286687, filed on Sep. 30, 2002, the entire contents which being incorporated herein by reference.

BACKGROUND OF THE INVENTION

1. Field of the Invention

The present invention relates to a semiconductor device in which moisture resistance in a multilayered wire structure is improved and a method of manufacturing the same, and a phase shift mask usable in manufacturing the semiconductor device.

2. Description of the Related Art

In recent years, a design rule of the multilayered wire structure has a tendency to be reduced in size as the LSI makes its transition. For this reason, some of wires, which are formed by forming a film for metal wire material and directly etching the film, are too small to manufacture. Hence, the following method is adopted as the method of forming the wire. That is, after forming an interlayer insulation film, a trench pattern or a hole pattern is formed in this interlayer insulation film, and a wire material is embedded in an opening region of the pattern, thereby forming the wire. This method of forming the wire is referred to as a damascene method.

When the wire is formed by the etching, W, Al or an Al alloy is often used as a wire material. However, when the damascene method is employed, Cu is sometimes used because of its low electric resistance and high resistance to electromigration.

In manufacturing the semiconductor device, elements such as transistors, contacts, wires, pads are formed on a semiconductor wafer. Thereafter, the semiconductor wafer is divided into a plurality of chips, each of which is packaged using ceramic or plastic.

In order to speed up a transmission rate of a signal, which is important for performance of the wire, reduction in capacitance between wires and in capacitance parasitic between wires which are provided in different layers is effective. Therefore, emphasis has been recently placed on lowering a dielectric constant of an insulation film which exists between the wires provided in the same layer and of the interlayer insulation film which exists between the wires provided in the different layers, as well as lowering the resistance of the wire itself. Further, in order to lower the dielectric constant, a fluorine-doped silicon oxide film, an inorganic insulation film, an organic insulation film, and the like other than a silicon oxide film are recently used as the interlayer insulation film, instead of the silicon oxide film. In general, as a distance between atoms or molecules of the material becomes larger, the dielectric constant becomes lower due to simple lowering of a film density.

However, a coefficient of thermal expansion of the above-described interlayer insulation film having the low dielectric constant is substantially different from coefficients of thermal expansion of other constituting materials such as a substrate. Because of this difference in the coefficient of thermal expansion, large thermal stress is generated by the heat treatment to follow. The thermal stress is concentrated on a corner of the chip to cause stress concentration, and peeling between layers or a crack may occur at the corner of the chip. When the crack is caused, moisture as a disturbance easily enters into the chip. The stress concentration due to the difference in the coefficient of thermal expansion like the above is especially significant in the semiconductor device to which the damascene method is adopted. The reason is that, according to the damascene method, an abundance of portions whose coefficients of thermal expansion are substantially different from each other exist, because the interlayer insulation film is formed on a flattened wire layer or the like, the trench pattern or the like is formed in the interlayer insulation film, and thereafter, the wire material is embedded in the opening region. Therefore, the conventional semiconductor device to which the damascene method is adopted has a disadvantage that it is difficult to secure a sufficient moisture resistance.

SUMMARY OF THE INVENTION

The present invention is made in view of the above disadvantage, and its object is to provide a semiconductor device which can prevent the increase in chip area and secure a high moisture resistance while preventing peeling in a peripheral edge portion, and a method of manufacturing the same, and a phase shift mask usable in manufacturing and the like of the semiconductor device.

As a result of assiduous studies, the inventor of the present invention has come up with various forms of the invention described below.

A semiconductor device according to the present invention comprises an integrated circuit part in which an integrated circuit is formed, a main wall part including metal films surrounding the integrated circuit part, and a sub-wall part including metal films selectively formed between the integrated circuit part and the main wall part. The integrated circuit part, the main wall part and the sub-wall part share a semiconductor substrate, and one or two or more interlayer insulation film(s) formed above the semiconductor substrate, in which openings are selectively formed. A part of wires constituting the integrated circuit and a part of the metal films which are provided to each of the main wall part and the sub-wall part are substantially formed as a same layer.

According to the present invention, since the sub-wall part is selectively formed between the main wall part and the integrated circuit part, a wall part selectively has a double structure of the main wall part and the sub-wall part. Therefore, even when large stress is concentrated on a corner of the semiconductor substrate or the like by adopting the damascene method, the stress is dispersed to the sub-wall part as well, by disposing the sub-wall part at the position where the stress is easily concentrated. Thereby, an elastic structure is formed at the position in which stress relaxation is not caused due to peeling between layers, a crack and the like. Consequently, it is possible to keep an entry ratio of moisture accompanied by the occurrence of the crack low, and to ensure a high moisture resistance. Further, since a part of the wires and a part of the metal films are substantially formed as the same layer, the metal film can be formed simultaneously with the wire. Hence, it is possible to avoid the increase in the number of processes.

A method of manufacturing a semiconductor device according to the present invention is the method of manufacturing the semiconductor device including an integrated circuit part in which an integrated circuit is formed and a main wall part including metal films surrounding the integrated circuit part. The method comprises the step of selectively forming a sub-wall part including metal films between the integrated circuit part and the main wall part, in parallel to formation of the integrated circuit part and the main wall part.

A phase shift mask according to the present invention is a phase shift mask comprising a phase shifter film formed on a transparent substrate, and a light shield film formed in a scribe line region on the transparent substrate. A region surrounded by the scribe line region is constituted of an integrated circuit region with which an integrated circuit part is to be formed and a peripheral edge region with which a peripheral edge part in a periphery of the integrated circuit part is to be formed. The light shield film is further formed at least in a part of the peripheral edge region and the integrated circuit region.

DETAILED DESCRIPTION OF THE PREFERRED EMBODIMENTS

Hereinafter, a semiconductor device and a method of manufacturing the same according to embodiments of the present invention will be explained concretely with reference to the attached drawings.

-First Embodiment-

Figure 1:
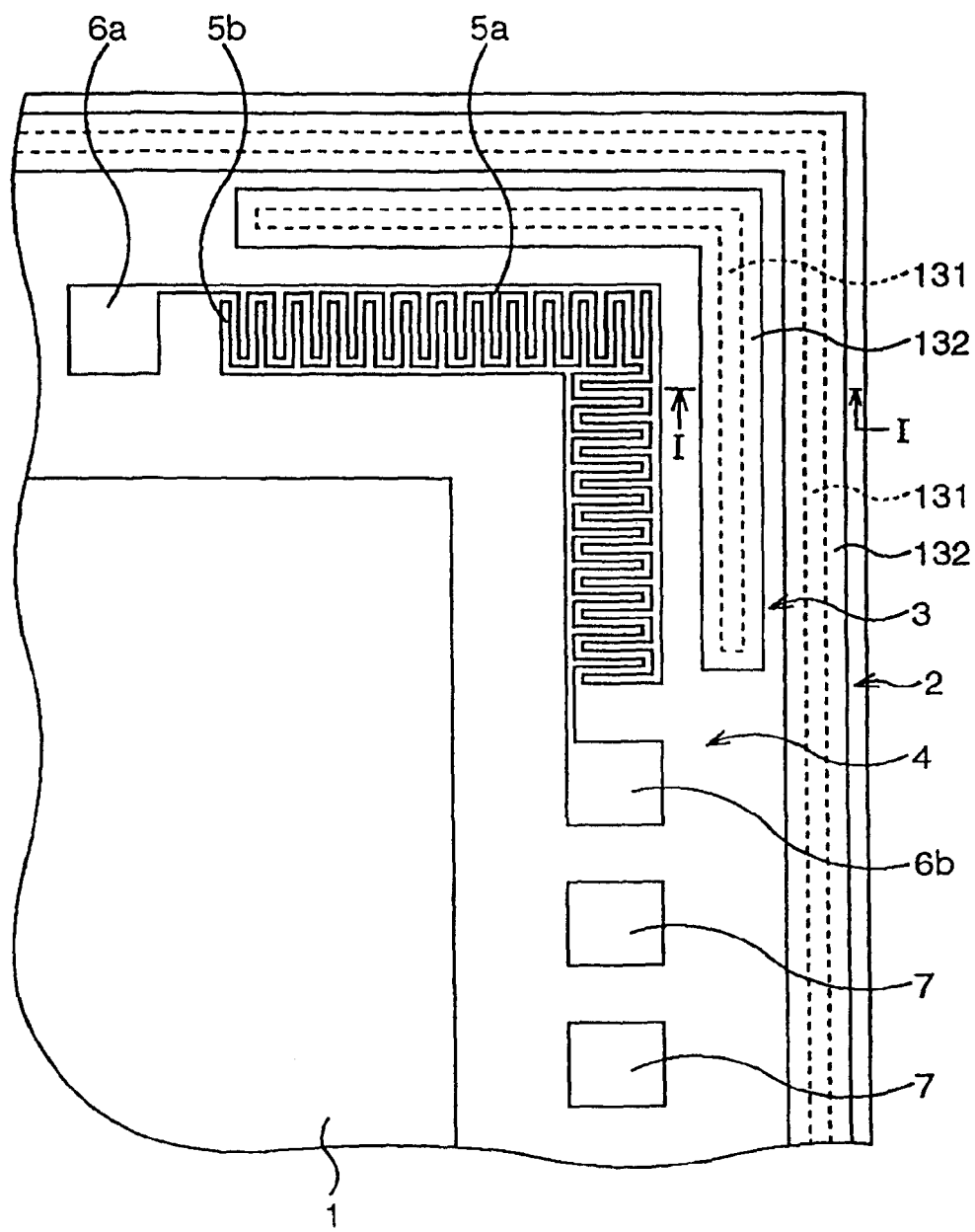
FIG. 1 is a layout showing the structure of a semiconductor device according to a first embodiment of the present invention.
Figure 2:
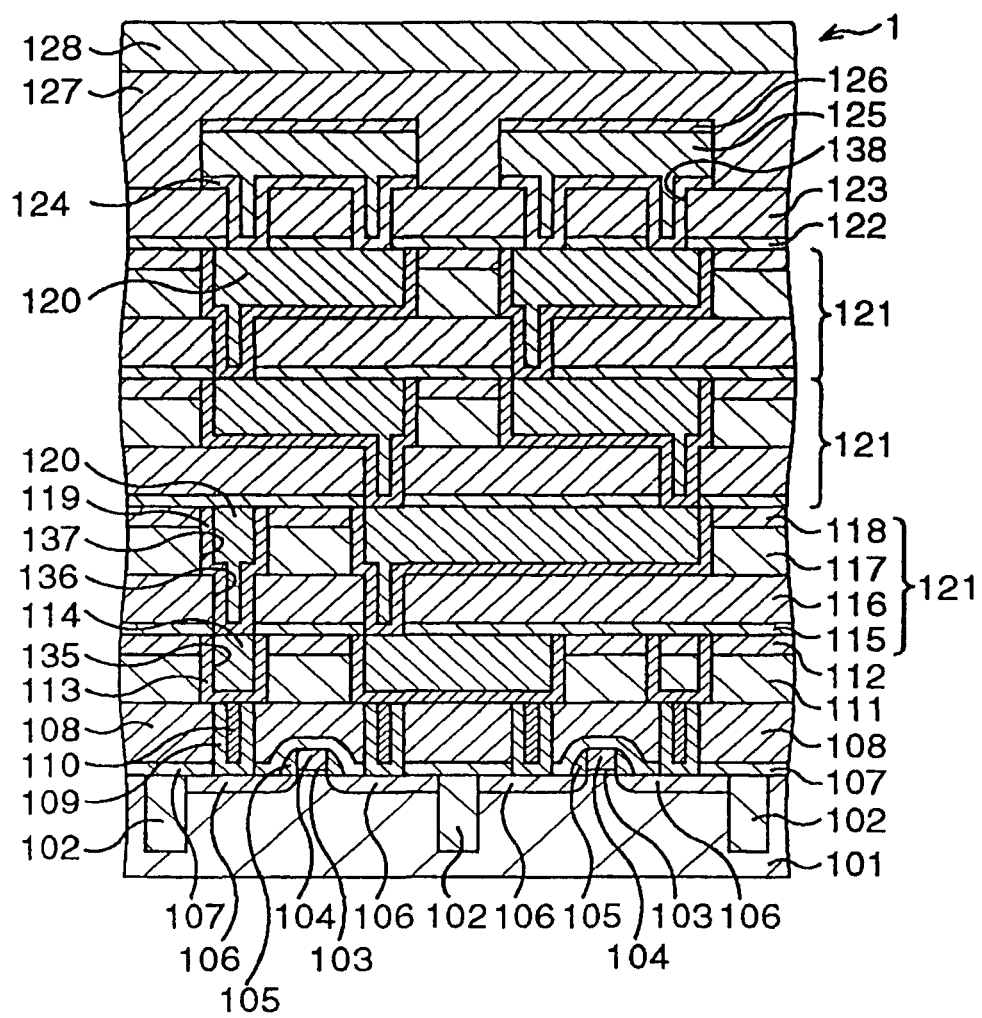
FIG. 2 is a sectional view showing the structure of an integrated circuit part of the first embodiment.
Figure 3:
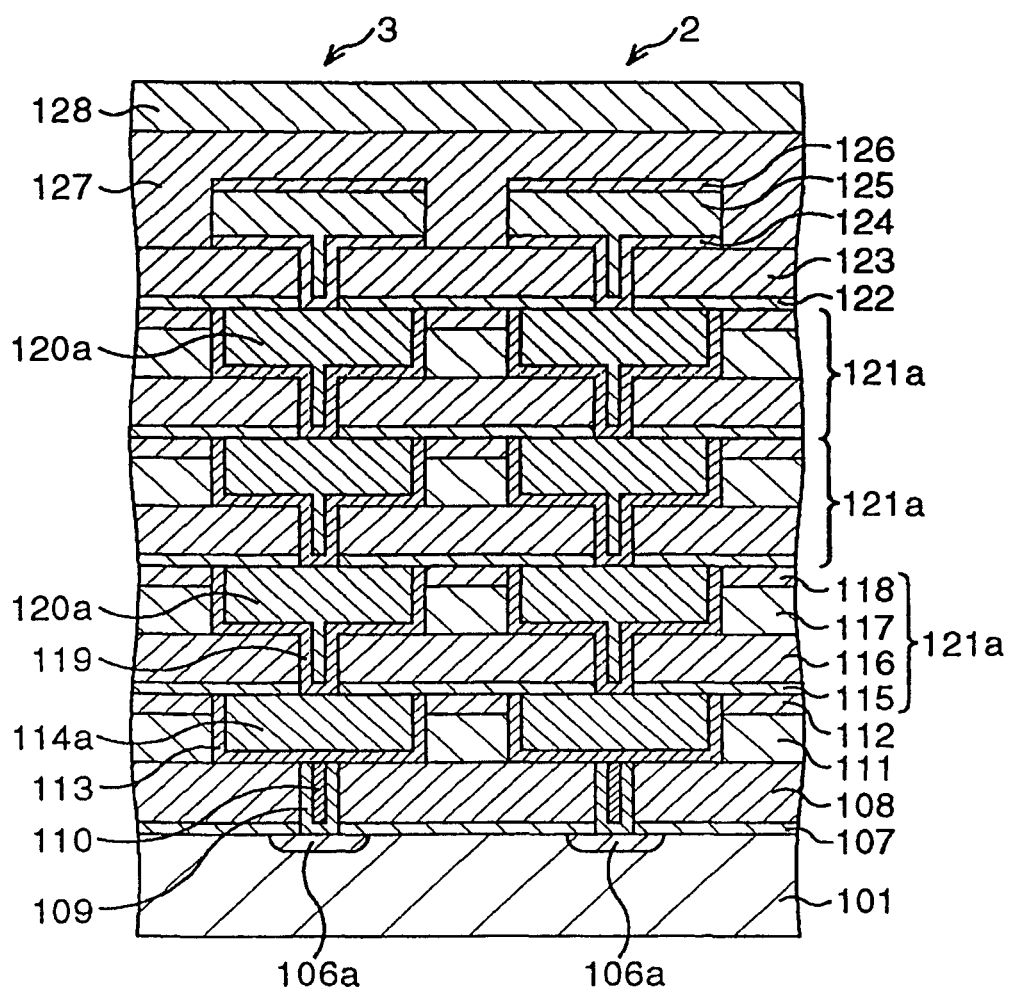
FIG. 3 is a sectional view showing a section taken along the I-I line in FIG. 1.
Figure 4:
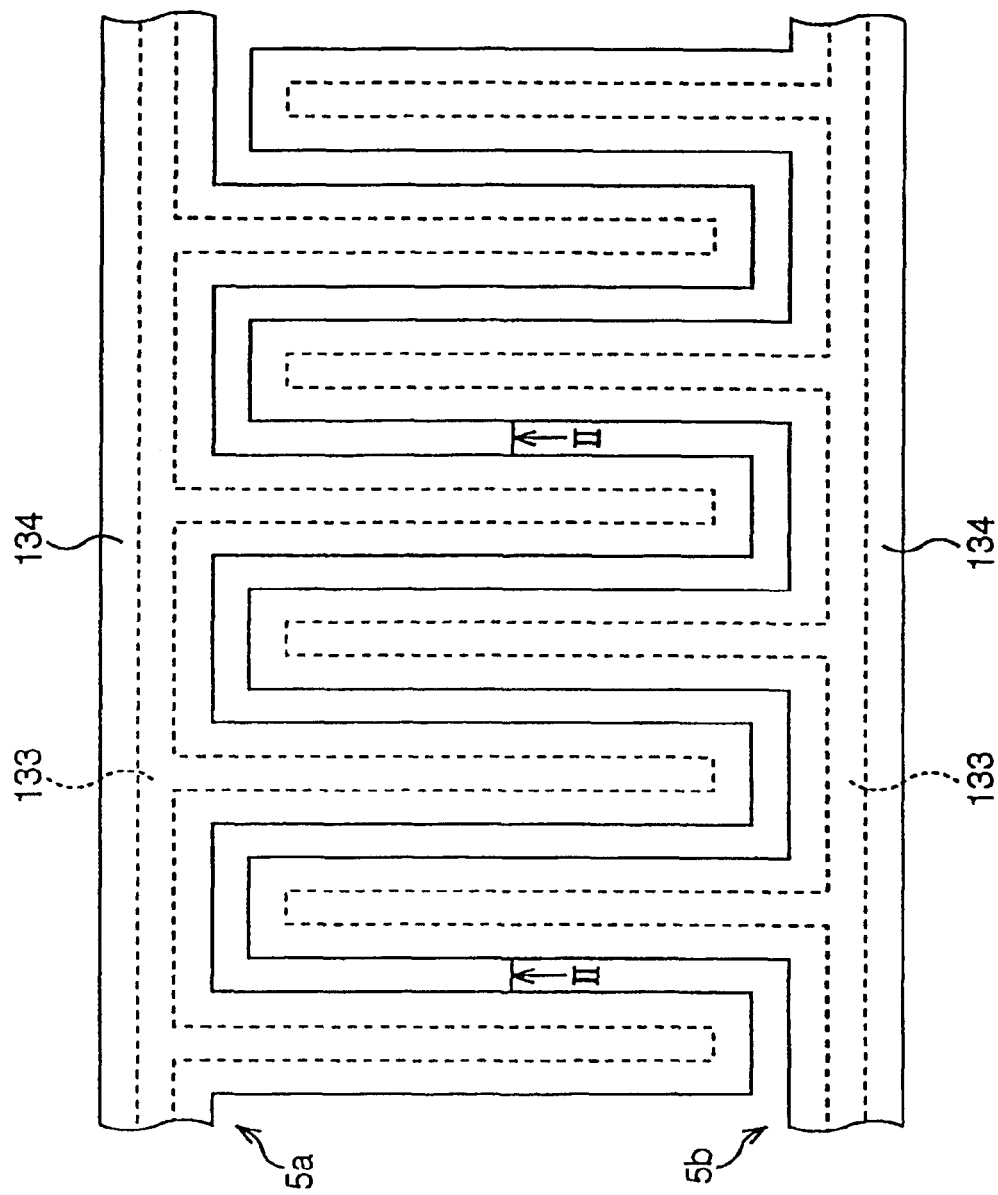
FIG. 4 is a layout showing the structure of a resistance value measuring part of the first embodiment.
Figure 5:
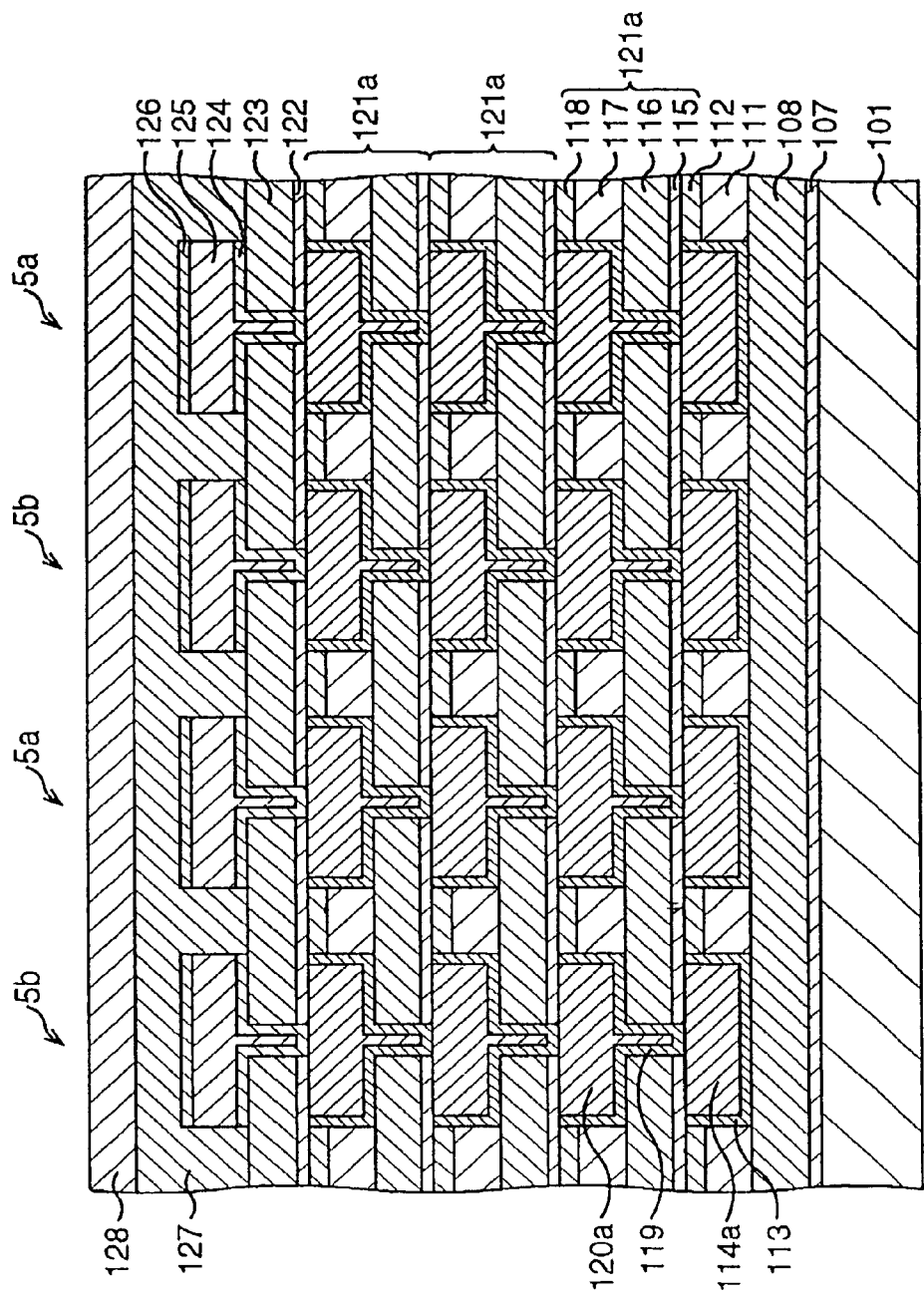
FIG. 5 is a sectional view taken along the II-II line in FIG. 4.

To begin with, a first embodiment of the present invention will be explained. FIG. 1 is a layout showing the structure of a semiconductor device according to the first embodiment of the present invention. FIG. 2 is a sectional view showing the structure of an integrated circuit part of the first embodiment, and FIG. 3 is a sectional view showing a section taken along the I-I line in FIG. 1. FIG. 4 is a layout showing the structure of a resistance value measuring part of the first embodiment, and FIG. 5 is a sectional view taken along the II-II line in FIG. 4.

According to the first embodiment, as shown in FIG. 1, a main wall part 2 which is, for example, in a rectangular shape is provided so as to surround an integrated circuit part 1 in which a semiconductor integrated circuit is formed. The semiconductor device according to this embodiment is diced along the main wall part 2 outside the main wall part 2, and is in a rectangular shape in plan view. A sub-wall part 3 which is, for example, in an "L" shape is provided between each corner of the main wall part 2 and the integrated circuit part 1. Portions of the sub-wall part 3 which are orthogonal to each other respectively extend in parallel to portions of the main wall part 2 which are orthogonal to each other, that is, the portions corresponding to its sides. A space between the main wall part 2 and the sub-wall part 3 is, for example, about 1 μm. Further, a bend of the sub-wall part 3 is placed closest to a bend of the main wall part 2, that is, a position corresponding to a vertex. Additionally, a resistance value measuring part (resistance value measuring means) 4 is provided between the sub-wall part 3 and the integrated circuit part 1, for measuring a resistance value of the region. In this embodiment, the sub-wall part 3 is a first wall piece.

In the integrated circuit part 1, a plurality of MOS transistors and the like are formed as shown in FIG. 2. For example, a semiconductor substrate 101 such as a silicon substrate is demarcated into a plurality of element active regions by element isolation insulation films 102. Then, gate insulation films 103 and gate electrodes 104 are formed on the semiconductor substrate 101. On the sides of the gate insulation films 103 and the gate electrodes 104, sidewall insulation films 105 are formed. On the surface of the semiconductor substrate 101, source/drain diffusion layers 106 are formed so as to sandwich the gate insulation films 103 and the gate electrodes 104 therebetween in plan view.

Further, a silicon nitride film 107 and a silicon oxide film 108, for example, are formed over the entire surface, and contact holes reaching the source/drain diffusion layers 106 are formed in the silicon nitride film 107 and the silicon oxide film 108. The contact hole is, for example, about 0.10 to 0.20 μm in diameter. Moreover, TiN films 109, for example, are formed as glue layers so as to cover the side surfaces and the bottom surfaces of the contact holes, in each of which a W film 110 is embedded.

Furthermore, an organic insulation film 111 and a silicon oxide film 112, for example, are formed over the entire surface, and trenches 135 reaching the TiN films 109 and the W films 110 are formed in the organic insulation film 111 and the silicon oxide film 112. Ta films 113, for example, are formed as barrier metal films so as to cover the side surfaces and the bottom surfaces of the trenches 135, in each of which a wire 114 which is made of Cu or the like is embedded.

Further, a silicon nitride film 115 and a silicon oxide film 116, for example, are formed as interlayer insulation films over the entire surface, and contact holes 136 reaching the underlying wires, that is, the wires 114, are formed in the silicon nitride film 115 and the silicon oxide film 116. The contact hole is, for example, about 0.15 to 0.25 μm in diameter.

Moreover, an organic insulation film 117 and a silicon oxide film 118, for example, are formed over the entire surface, and trenches 137 which are connected to the contact holes 136 formed in the silicon nitride film 115 and the silicon oxide film 116 are formed in the organic insulation film 117 and the silicon oxide film 118. Ta films 119, for example, are formed as barrier metal films so as to cover the side surfaces and the bottom surfaces of the contact holes 136 and the trenches 137, in each of which a wire 120 which is made of Cu or the like is embedded.

A plurality of basic structural bodies 121, each of which is made of the silicon nitride film 115, the silicon oxide film 116, the organic insulation film 117, the silicon oxide film 118, the Ta films 119 and the wires 120 like the above, three of the basic structural bodies 121 in total in this embodiment, are provided.

Further, a silicon nitride film 122 and a silicon oxide film 123 are formed on the uppermost basic structural body 121, and contact holes 138 reaching the wires 120, which constitute the uppermost basic structural body 121, are formed in the silicon nitride film 122 and the silicon oxide film 123. The contact hole is, for example, about 1.00 to 1.10 μm in diameter. Moreover, barrier metal films 124 are formed so as to cover the side surfaces and the bottom surfaces of the contact holes 138 and to cover a part of the surface of the silicon oxide film 123, and Al or Al alloy films (hereinafter referred to as the Al film) 125 and barrier metal films 126 are formed on the barrier metal films 124. Furthermore, a silicon oxide film 127 is formed over the entire surface so as to cover the barrier metal films 124, the Al films 125 and the barrier metal films 126, and a silicon nitride film 128, for example, is formed on the silicon oxide film 127 as a coating film.

Incidentally, when the two MOS transistors shown in FIG. 2 constitute a CMOS transistor, conduction types of the diffusion layers 106 are different between the respective MOS transistors, and wells (not shown) are appropriately formed in the surface of the semiconductor substrate 101.

Meanwhile, as shown in FIG. 3, diffusion layers 106a are formed in the surface of the semiconductor substrate 101 in the main wall part 2 and the sub-wall part 3. Conduction types of the diffusion layers 106a are not particularly limited. Further, similarly to the integrated circuit part 1, the silicon nitride film 107 and the silicon oxide film 108, for example, are formed over the entire surface, and trenches reaching the diffusion layers 106a are formed in the silicon nitride film 107 and the silicon oxide film 108. The trench is, for example, about 0.15 to 0.30 μm in width. The TiN films 109, for example, are formed as the glue layers so as to cover the side surfaces and the bottom surfaces of the trenches, in each of which the W film 110 is embedded.

Furthermore, similarly to the integrated circuit part 1, the organic insulation film 111 and the silicon oxide film 112, for example, are formed over the entire surface, and trenches reaching the TiN films 109 and the W films 110 are formed in the organic insulation film 111 and the silicon oxide film 112. The trench is, for example, about 2 μm in width. Each of the trenches is formed, for example, so that the TiN film 109 and the W film 110 are placed at its center. The Ta films 113, for example, are formed as the barrier metal films so as to cover the side surfaces and the bottom surfaces of the trenches, in each of which a metal film 114a which is made of Cu or the like is embedded.

Moreover, similarly to the integrated circuit part 1, the silicon nitride film 115 and the silicon oxide film 116, for example, are formed over the entire surface, and trenches reaching the underlying metal films, that is, the metal films 114a, are formed in the silicon nitride film 115 and the silicon oxide film 116. The trench is, for example, about 0.20 to 0.35 μm in width. Each of the trenches is formed to be placed at the center of the trench which is formed in the organic insulation film 111 and the silicon oxide film 112, for example. Therefore, this trench is, for example, at the same position with the trench which is formed in the silicon nitride film 107 and the silicon oxide film 108 in plan view.

Further, similarly to the integrated circuit part 1, the organic insulation film 117 and the silicon oxide film 118 are formed over the entire surface, and trenches which are connected to the trenches formed in the silicon nitride film 115 and the silicon oxide film 116 are formed in the organic insulation film 117 and the silicon oxide film 118. The trench is, for example, about 2 μm in width. This trench is formed, for example, so that the trench formed in the silicon nitride film 115 and the silicon oxide film 116 is placed at its center. Therefore, this trench is, for example, at the same position with the trench which is formed in the organic insulation film 111 and the silicon oxide film 112 in plan view. The Ta films 119, for example, are formed as the barrier metal films so as to cover the side surfaces and the bottom surfaces of the trenches formed in the silicon nitride film 115 and the silicon oxide film 116 and the trenches formed in the organic insulation film 117 and the silicon oxide film 118, in each of which a metal film 120a which is made of a Cu film or the like is embedded.

A plurality of basic structural bodies 121a, each of which is made of the silicon nitride film 115, the silicon oxide film 116, the organic insulation film 117, the silicon oxide film 118, the Ta films 119 and the metal films 120a like the above, three of the basic structural bodies 121a in total in this embodiment, similarly to the integrated circuit part 1, are provided.

Further, similarly to the integrated circuit part 1, the silicon nitride film 122 and the silicon oxide film 123 are formed on the uppermost basic structural body 121a, and trenches reaching the metal films 120a, which constitute the uppermost basic structural body 121a, are formed in the silicon nitride film 122 and the silicon oxide film 123. The trench is, for example, about 1.15 to 1.25 µm in width. The barrier metal films 124 are formed so as to cover the side surfaces and the bottom surfaces of the trenches and to cover a part of the surface of the silicon oxide film 123, and the Al films 125 and the barrier metal films 126 are formed on the barrier metal films 124. Moreover, the silicon oxide film 127 is formed over the entire surface so as to cover the barrier metal films 124, the Al films 125 and the barrier metal films 126, and the silicon nitride film 128, for example, is formed on the silicon oxide film 127 as the coating film.

In the sub-wall part 3, the trench formed in the silicon nitride film 115 and the silicon oxide film 116 and a narrow trench 131 formed in the silicon nitride film 122 and the silicon oxide film 123 are shorter than the trench formed in the organic insulation film 111 and the silicon oxide film 112 and a wide trench 132 formed in the organic insulation film 117 and the silicon oxide film 118 and, as shown in FIG. 1, both end parts of the narrow trench 131 are placed inside both end parts of the wide trench 132.

As shown in FIG. 1 and FIG. 4, two comb-like electrodes 5a and 5b are provided in the resistance value measuring part 4. Teeth of the comb-like electrodes 5a and 5b are arranged in an alternating manner. Each of monitor pads for checking to secure moisture resistance 6a and 6b is connected to one end of each comb-like electrode 5a and 5b. Further, in the region between the integrated circuit part 1 and the main wall part 2 where the sub-wall part 3 and the resistance value measuring part 4 are not formed, a plurality of evaluation pads 7 for inputting signals from the outside in evaluating the integrated circuit formed in the integrated circuit part 1 are provided at appropriate intervals.

As shown in FIG. 5, the sectional structure of the comb-like electrodes 5a and 5b is the same as that of the main wall part 2 and the sub-wall part 3, except that the metal films are not connected to the substrate. However, the widths of the trenches are different. Namely, in the comb-like electrodes 5a and 5b, the trench formed in the silicon nitride film 115 and the silicon oxide film 116 and the narrow trench 133 formed in the silicon nitride film 122 and the silicon oxide film 123 are, for example, about 0.20 to 0.35 µm in width, and the trench formed in the organic insulation film 111 and the silicon oxide film 112 and the wide trench 134 formed in the organic insulation film 117 and the silicon oxide film 118 are, for example, about 0.6 µm in width. Further, spaces between the teeth of the comb-like electrodes 5a and 5b are, for example, about 0.2 µm. A part of the Al films 125 is exposed from the silicon nitride film 128 and the silicon oxide film 127 to make the pads 6a and 6b.

In thus-structured first embodiment, the sub-wall part 3 in the "L" shape is selectively provided inside the main wall part 2 in the rectangular shape in plan view, and at each of the four corners of the main wall part 2, at which stress is most concentrated, and a plurality of the metal films constituting the main wall part 2 and the sub-wall part 3 are connected to the semiconductor substrate 101, and hence, the stress is easily dispersed at the corners. Therefore, even if the stress is concentrated due to heat treatment or the like, peeling between layers and a crack are unlikely to occur, as compared with the conventional art. Further, even if the crack and the like occur at the corner, moisture from the outside hardly reaches the integrated circuit part 1 since the main wall part 2 and the sub-wall part 3 have the double structure. Consequently, according to this embodiment, it is possible to ensure an extremely high moisture resistance.

Furthermore, since the position where the sub-wall part 3 is formed is the region where the pads and the like are not formed and the element particularly affecting the function of the semiconductor device does not exist in the conventional art, a chip area hardly increases even when the sub-wall part 3 is provided at this position.

Moreover, the main wall part 2 and the sub-wall part 3 can be formed by changing mask shapes in forming the silicon nitride film, the silicon oxide film, the organic insulation film, the wire and the like which constitute the integrated circuit part 1, and therefore, it is also possible to avoid the increase in the number of manufacturing processes.

Furthermore, potentials which are different from each other can be applied to the pads 6a and 6b in the resistance value measuring part 4, thereby measuring a resistance value therebetween. If there is entry of moisture, a short circuit occurs and the resistance value decreases. By measuring the resistance value, it is possible to determine whether there is the entry of moisture or not. Hence, it is possible to obtain high reliability.

-Second Embodiment-

Figure 6:
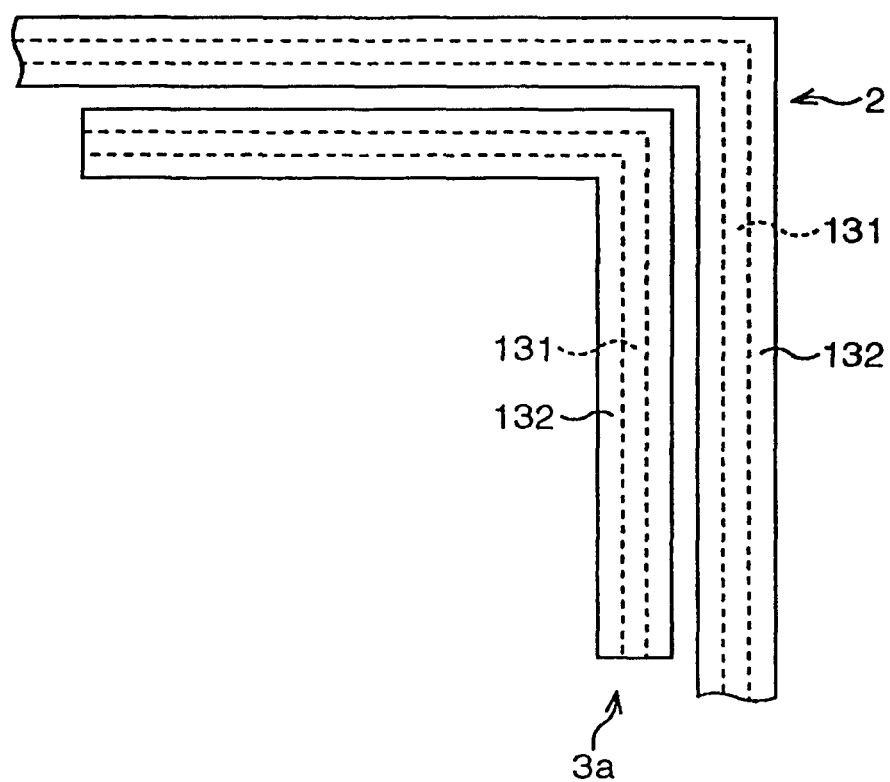
FIG. 6 is a layout showing the structure of wall parts of a semiconductor device according to a second embodiment of the present invention.

Next, a second embodiment of the present invention will be explained. FIG. 6 is a layout showing the structure of wall parts of a semiconductor device according to the second embodiment of the present invention.

According to the second embodiment, the structure of a sub-wall part is different from that of the first embodiment. In concrete, as shown in FIG. 6, the length of a narrow trench 131 and the length of a wide trench 132 in a sub-wall part 3a are the same with reference to a bending point, and, respective end parts are at the same positions in plan view. The structure of a section of each position of the sub-wall part 3a which crosses perpendicularly to a direction toward which the trenches extend is the same as that of the sub-wall part 3 in the first embodiment, except for the lengths of the trenches as described above. In this embodiment, the sub-wall part 3a is a first wall piece.

It is also possible to obtain the same effects as those of the first embodiment according to the second embodiment as above.

-Third Embodiment-

Figure 7:
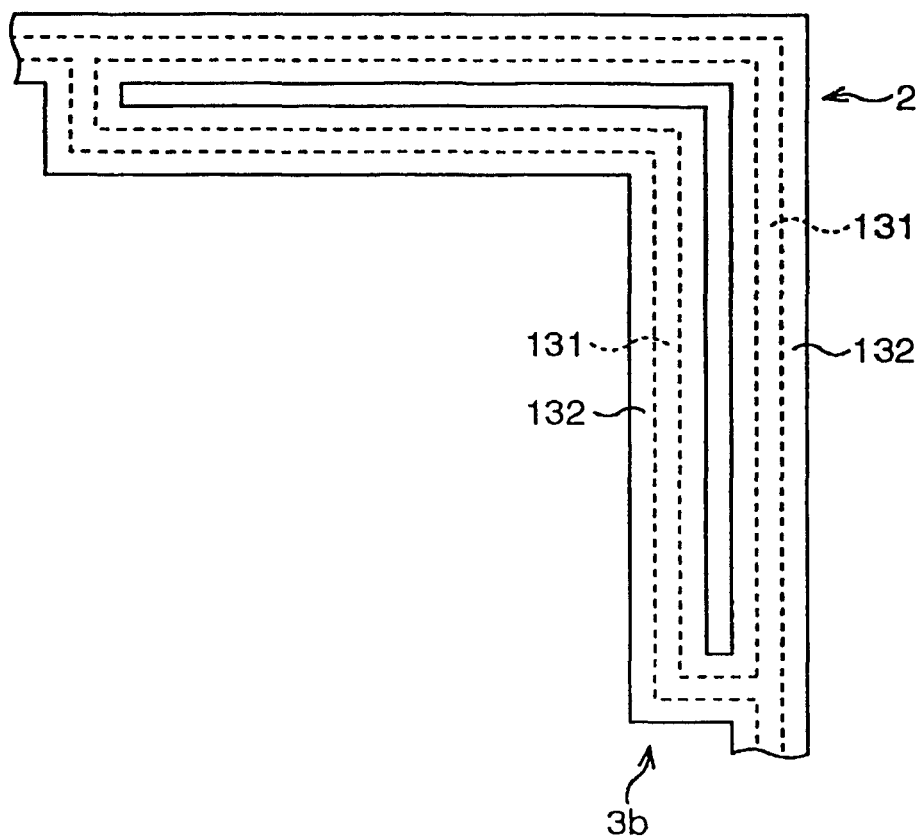
FIG. 7 is a layout showing the structure of wall parts of a semiconductor device according to a third embodiment of the present invention.

Next, a third embodiment of the present invention will be explained. FIG. 7 is a layout showing the structure of wall parts of a semiconductor device according to the third embodiment of the present invention.

According to the third embodiment as well, the structure of a sub-wall part is different from that of the first embodiment. In concrete, as shown in FIG. 7, a sub-wall part 3b has a plan shape in which both end parts of the sub-wall part 3 of the first embodiment are bent perpendicularly toward the main wall part 2 side and are connected to the main wall part 2. In addition, a narrow trench 131 in the sub-wall part 3b is connected to a narrow trench 131 in the main wall part 2, and a wide trench 132 in the sub-wall part 3b is connected to a wide trench 132 in the main wall part 2. The structure of a section of each position of the sub-wall part 3b which crosses perpendicularly to a direction toward which the trenches extend is the same as that of the sub-wall part 3 in the first embodiment, except for the plan shape as described above. In this embodiment, the sub-wall part 3b is a first wall piece.

It is also possible to obtain the same effects as those of the first embodiment according to the third embodiment as above. Further, since the sub-wall part is coupled to the main wall part, it is more unlikely that a crack makes progress. Hence, an insulation film, into which moisture easily enters, is completely cut between the inside and the outside of the sub-wall part, whereby peeling is more unlikely to occur.

-Fourth Embodiment-

Figure 8:
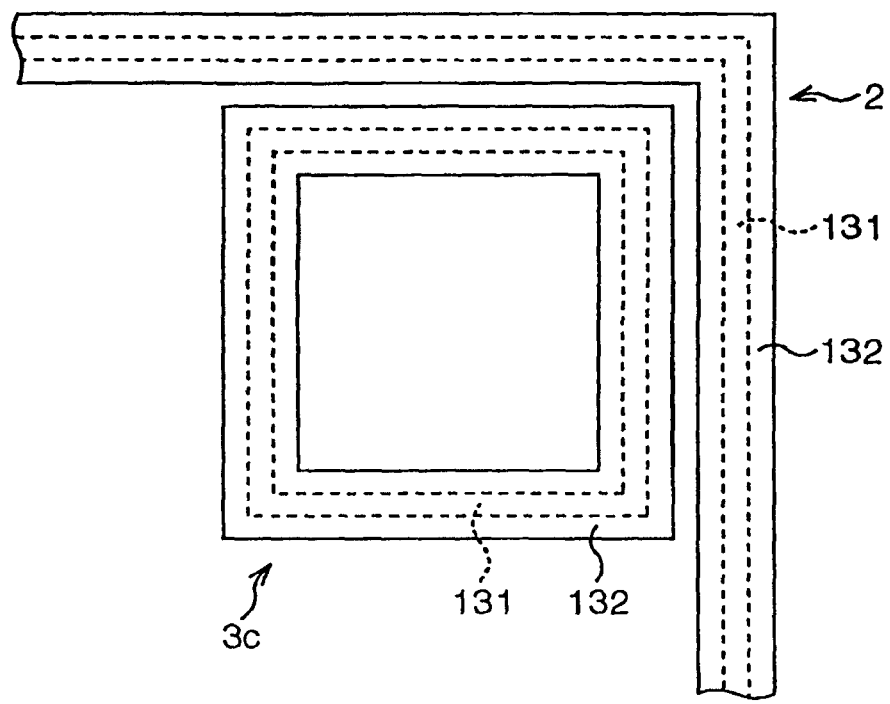
FIG. 8 is a layout showing the structure of wall parts of a semiconductor device according to a fourth embodiment of the present invention.

Next, a fourth embodiment of the present invention will be explained. FIG. 8 is a layout showing the structure of wall parts of a semiconductor device according to the fourth embodiment of the present invention.

According to the fourth embodiment as well, the structure of a sub-wall part is different from that of the first embodiment. In concrete, as shown in FIG. 8, a plan shape of a sub-wall part 3c is a rectangular shape. The structure of a section of each position of the sub-wall part 3c which crosses perpendicularly to a direction toward which the trenches extend is the same as that of the sub-wall part 3 in the first embodiment, except for the plan shape as described above. In addition, comb-like electrodes 5a and 5b (not shown in FIG. 8) which constitute a resistance value measuring part 4 are arranged, for example, so as to sandwich the sub-wall part 3c between the main wall part 2 and themselves. More specifically, the comb-like electrodes 5a and 5b are arranged, for example, along two sides which are alienated from a vertex of the main wall part 2, out of four sides constituting the sub-wall part 3c in the rectangular shape in plan view. In this embodiment, the sub-wall part 3c is a fourth wall piece.

It is also possible to obtain the same effects as those of the first embodiment according to the fourth embodiment as above.

-Fifth Embodiment-

Figure 9:
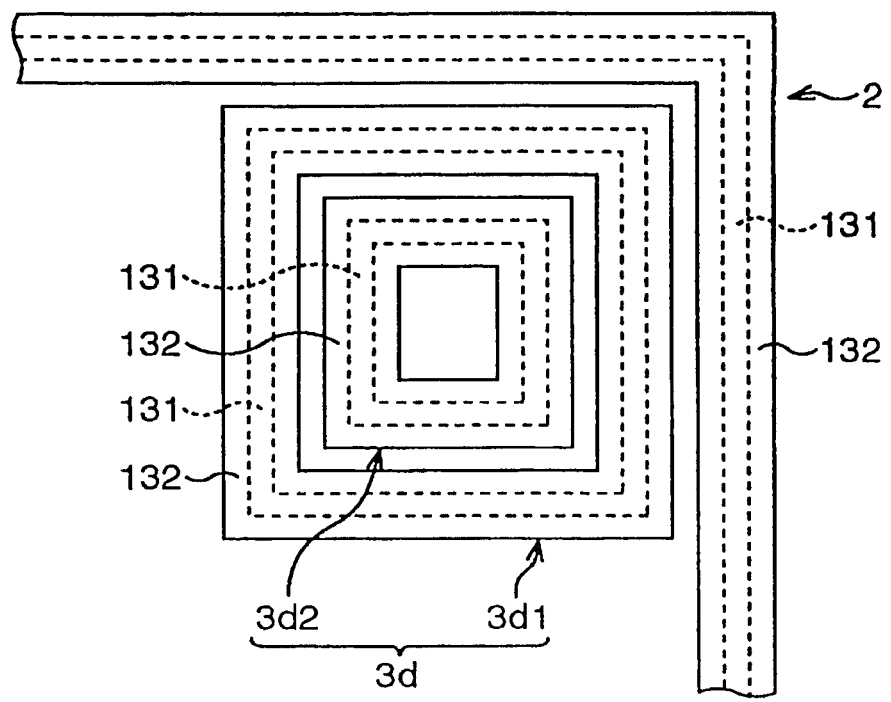
FIG. 9 is a layout showing the structure of wall parts of a semiconductor device according to a fifth embodiment of the present invention.

Next, a fifth embodiment of the present invention will be explained. FIG. 9 is a layout showing the structure of wall parts of a semiconductor device according to the fifth embodiment of the present invention.

According to the fifth embodiment as well, the structure of a sub-wall part is different from that of the first embodiment. In concrete, as shown in FIG. 9, a plurality of wall pieces, two rectangular wall pieces 3d1 and 3d2 in this embodiment, are provided as a sub-wall part 3d. In this embodiment, the wall piece 3d2 is a fourth wall piece, and the wall piece 3d1 is a fifth wall piece. The structure of a section of each position of the wall pieces 3d1 and 3d2 constituting the sub-wall part 3d which crosses perpendicularly to a direction toward which the trenches of extend is the same as that of the sub-wall part 3 in the first embodiment, except for the plan shape as described above.

According to the fifth embodiment as described above, it is possible to obtain a higher moisture resistance.

Incidentally, the sub-wall part 3d may be structured by three or more of the wall pieces.

-Sixth Embodiment-

Figure 10:
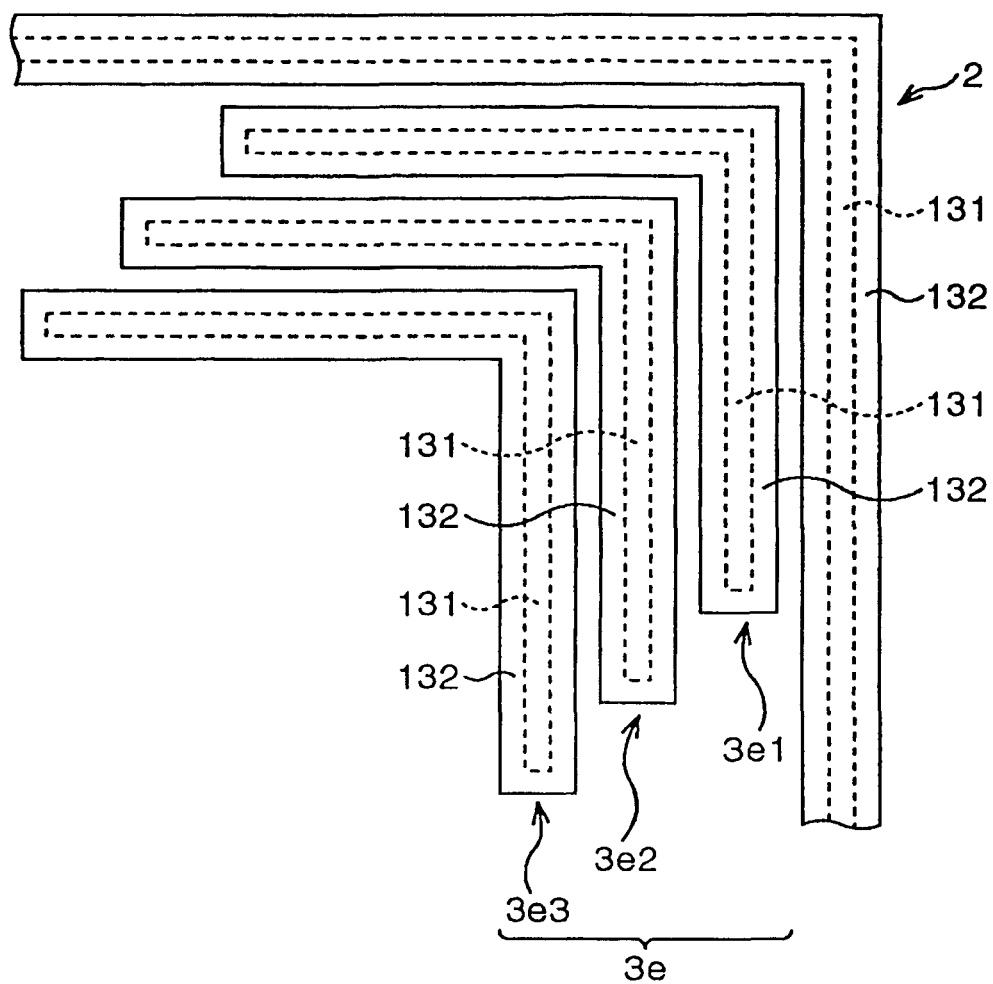
FIG. 10 is a layout showing the structure of wall parts of a semiconductor device according to a sixth embodiment of the present invention.

Next, a sixth embodiment of the present invention will be explained. FIG. 10 is a layout showing the structure of wall parts of a semiconductor device according to the sixth embodiment of the present invention.

According to the sixth embodiment as well, the structure of a sub-wall part is different from that of the first embodiment.

In concrete, as shown in FIG. 10, a plurality of, for example, three wall pieces 3e1 to 3e3 are arranged at, for example, regular intervals from a corner of the main wall part 2 toward an integrated circuit part 1 side, to constitute a sub-wall part 3e. Each of the wall pieces 3e1 to 3e3 has the same structure as that of the sub-wall part 3 of the first embodiment. In this embodiment, the wall pieces 3e1 to 3e3 are first wall pieces.

According to the sixth embodiment as described above, it is also possible to obtain a higher moisture resistance, similarly to the fifth embodiment.

Incidentally, the sub-wall part 3e may be structured by two or four or more wall pieces each of which has the same structure as that of the sub-wall part 3.

-Seventh Embodiment-

Figure 11:
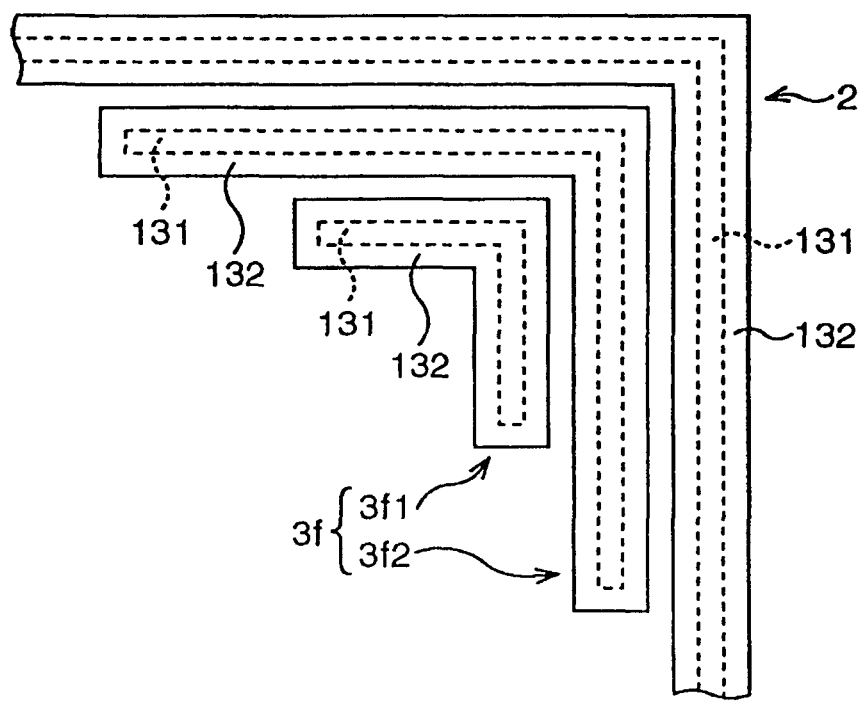
FIG. 11 is a layout showing the structure of wall parts of a semiconductor device according to a seventh embodiment of the present invention.

Next, a seventh embodiment of the present invention will be explained. FIG. 11 is a layout showing the structure of wall parts of a semiconductor device according to the seventh embodiment of the present invention.

According to the seventh embodiment as well, the structure of a sub-wall part is different from that of the first embodiment. In concrete, as shown in FIG. 11, a wall piece 3f1 which is shorter than a wall piece 3f2 is arranged on an integrated circuit part 1 side from the wall piece 3f2 which has the same structure as that of the sub-wall part 3 of the first embodiment, to constitute a sub-wall part 3f. The structure of a section of each position of the wall piece 3f1 which crosses perpendicularly to a direction toward which the trenches extend is the same as that of the sub-wall part 3 in the first embodiment. In this embodiment, the wall piece 3f2 is a first wall piece, and the wall piece 3f1 is a second wall piece.

According to the seventh embodiment as described above, it is also possible to obtain a higher moisture resistance, similarly to the fifth and the sixth embodiments.

-Eighth Embodiment-

Figure 12:
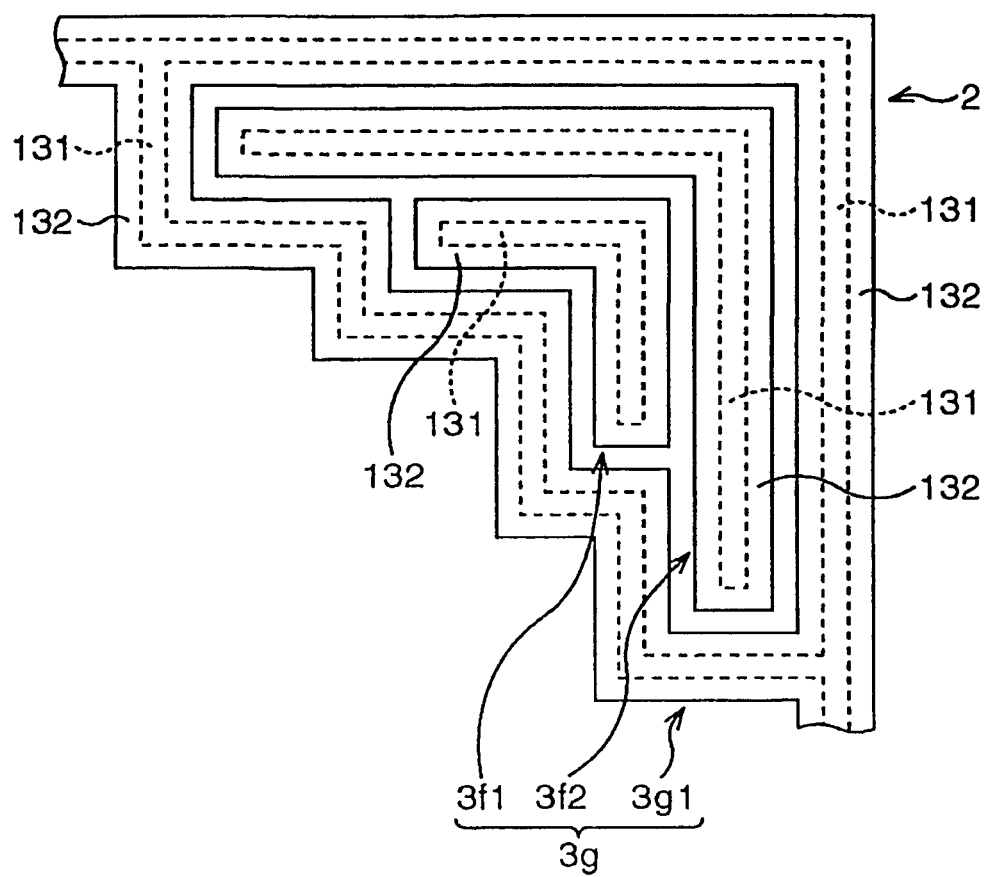
FIG. 12 is a layout showing the structure of wall parts of a semiconductor device according to an eighth embodiment of the present invention.

Next, an eighth embodiment of the present invention will be explained. FIG. 12 is a layout showing the structure of wall parts of a semiconductor device according to the eighth embodiment of the present invention.

According to the eighth embodiment as well, the structure of a sub-wall part is different from that of the first embodiment. In concrete, as shown in FIG. 12, a wall piece 3g1 which surrounds the wall pieces 3f1 and 3f2 of the seventh embodiment with the main wall part 2 is arranged to constitute a sub-wall part 3g. The structure of a section of each position of the wall piece 3g1 which crosses perpendicularly to a direction toward which the trenches extend is the same as that of the sub-wall part 3 in the first embodiment. In this embodiment, the wall piece 3g1 is a third wall piece.

According to the eighth embodiment as described above, it is also possible to obtain a higher moisture resistance, similarly to the fifth to the seventh embodiments.

-Ninth Embodiment-

Figure 13:
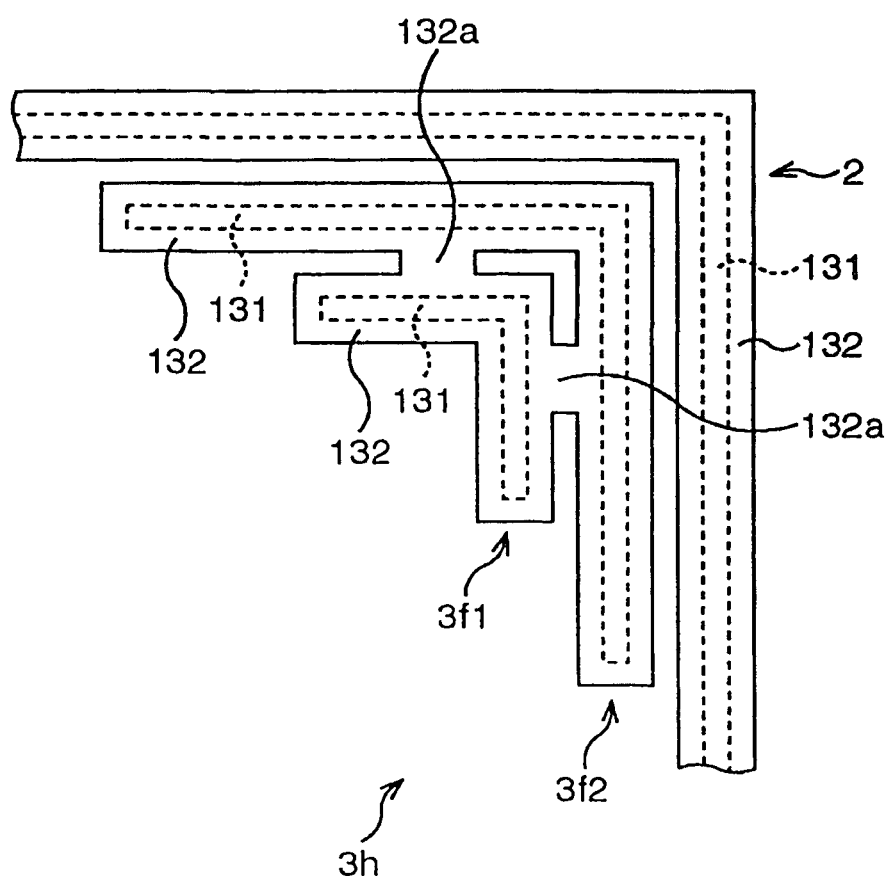
FIG. 13 is a layout showing the structure of wall parts of a semiconductor device according to a ninth embodiment of the present invention.

Next, a ninth embodiment of the present invention will be explained. FIG. 13 is a layout showing the structure of wall parts of a semiconductor device according to the ninth embodiment of the present invention.

According to the ninth embodiment as well, the structure of a sub-wall part is different from that of the first embodiment. In concrete, as shown in FIG. 13, wide trenches 132a which are the same as the trenches 132 of the wall pieces 3f1 and 3f2 of the seventh embodiment are formed in the organic insulation film 117 and the silicon oxide film 118 which exist between the wall pieces 3f1 and 3f2, and the Ta films 119 and the metal films 120a are embedded in the trenches 132a, to constitute a sub-wall part 3h.

According to the ninth embodiment as described above, it is also possible to obtain a higher moisture resistance, similarly to the fifth to the eighth embodiments.

-Tenth Embodiment-

Figure 14:
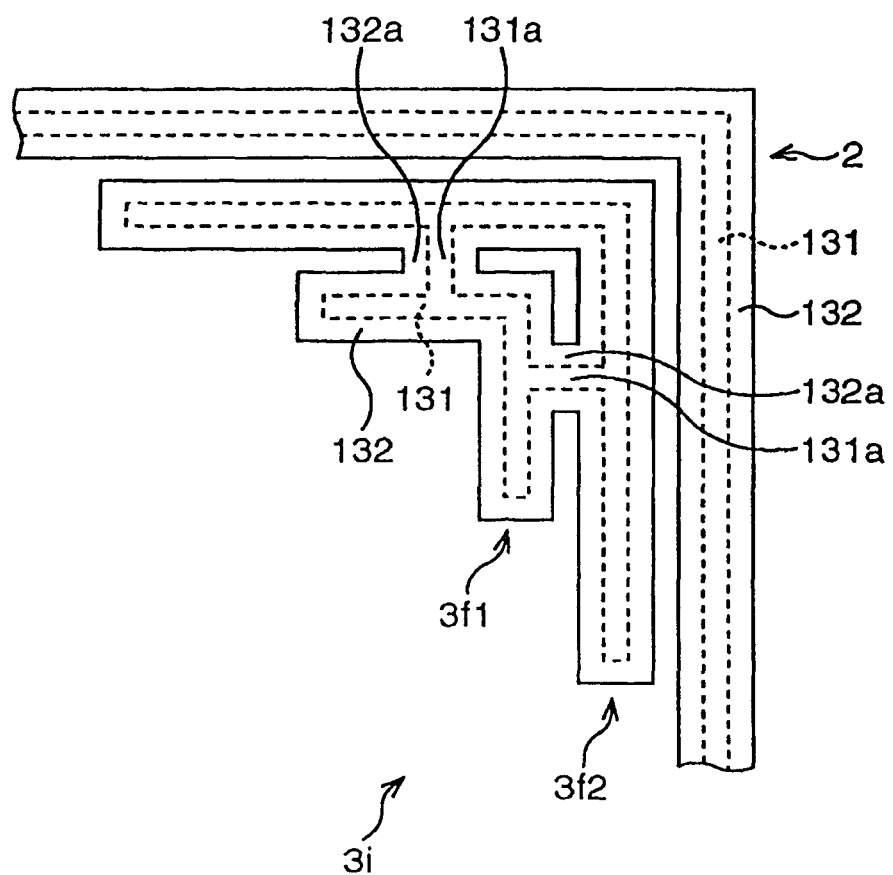
FIG. 14 is a layout showing the structure of wall parts of a semiconductor device according to a tenth embodiment of the present invention.

Next, a tenth embodiment of the present invention will be explained. FIG. 14 is a layout showing the structure of wall parts of a semiconductor device according to the tenth embodiment of the present invention.

According to the tenth embodiment as well, the structure of a sub-wall part is different from that of the first embodiment. In concrete, as shown in FIG. 14, the wide trenches 132a which are the same as the trenches 132 of the wall pieces 3f1 and 3f2 of the seventh embodiment are formed in the organic insulation film 117 and the silicon oxide film 118 which exist between the wall pieces 3f1 and 3f2. In addition, narrow trenches 131a which are the same as the trenches 131 of the wall pieces 3f1 and 3f2 are formed in the silicon nitride film 115 and the silicon oxide film 116 which exist between the wall pieces 3f1 and 3f2. The Ta films 119 and the metal films 120a are embedded in the trenches 131a and 132a, to constitute a sub-wall part 3i.

According to the tenth embodiment as described above, it is also possible to obtain a higher moisture resistance, similarly to the fifth to the ninth embodiments.

-Eleventh Embodiment-

Figure 15:
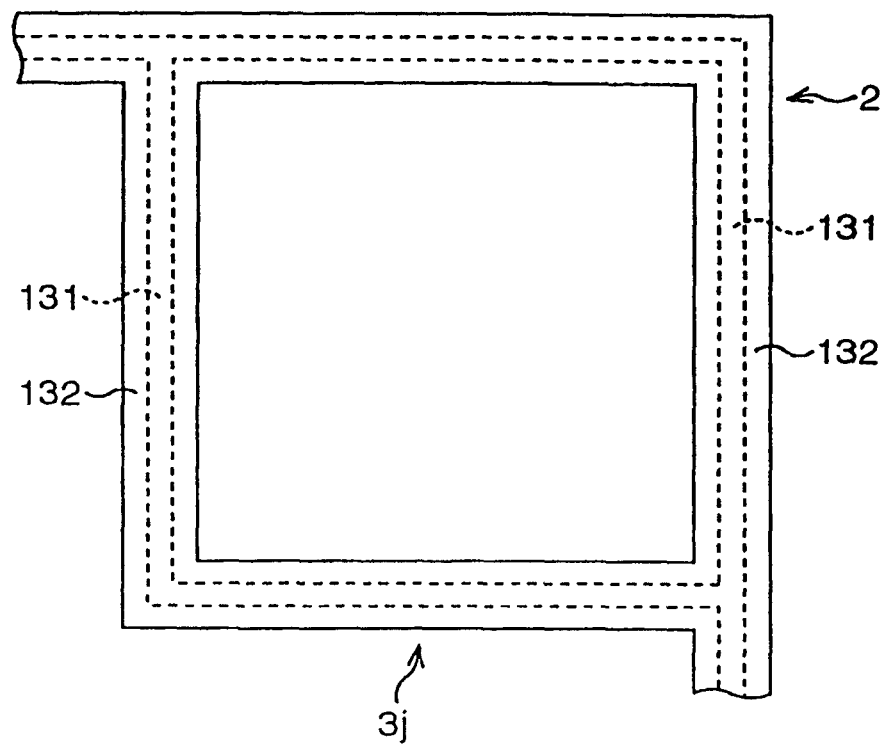
FIG. 15 is a layout showing the structure of wall parts of a semiconductor device according to an eleventh embodiment of the present invention.

Next, an eleventh embodiment of the present invention will be explained. FIG. 15 is a layout showing the structure of wall parts of a semiconductor device according to the eleventh embodiment of the present invention.

According to the eleventh embodiment as well, the structure of a sub-wall part is different from that of the first embodiment. In concrete, as shown in FIG. 15, a sub-wall part 3j which is in an "L" shape and both of whose ends are connected to the main wall part 2 is provided. The structure of a section of each position of the sub-wall part 3j which crosses perpendicularly to a direction toward which the trenches extend is the same as that of the sub-wall part 3 in the first embodiment. In this embodiment, the sub-wall part 3j is a sixth wall piece.

According to the eleventh embodiment as described above, it is also possible to obtain a higher moisture resistance, similarly to the fifth to the tenth embodiments.

Twelfth Embodiment-

Figure 16:
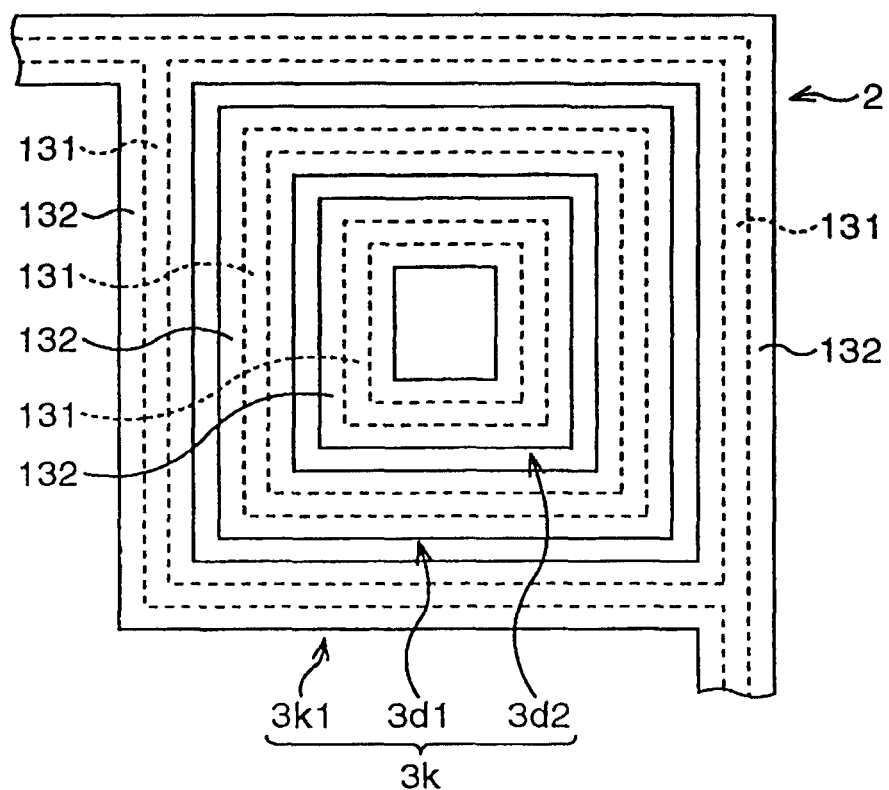
FIG. 16 is a layout showing the structure of wall parts of a semiconductor device according to a twelfth embodiment of the present invention.

Next, a twelfth embodiment of the present invention will be explained. FIG. 16 is a layout showing the structure of wall parts of a semiconductor device according to the twelfth embodiment of the present invention.

According to the twelfth embodiment, a sub-wall part has the structure in which the sub-wall part 3d of the fifth embodiment and the sub-wall part 3j of the eleventh embodiment are combined. In concrete, as shown in FIG. 16, the wall pieces 3d1 and 3d2 of the fifth embodiment are disposed in a square-shaped region existing between a wall piece 3k1 which has the same structure as that of the sub-wall part 3j of the eleventh embodiment and the main wall part 2, to constitute a sub-wall part 3k. In this embodiment, the wall piece 3k1 is a sixth wall piece.

According to the twelfth embodiment as described above, it is also possible to obtain a higher moisture resistance, similarly to the fifth to the eleventh embodiments.

-Thirteenth Embodiment-

Figure 17:
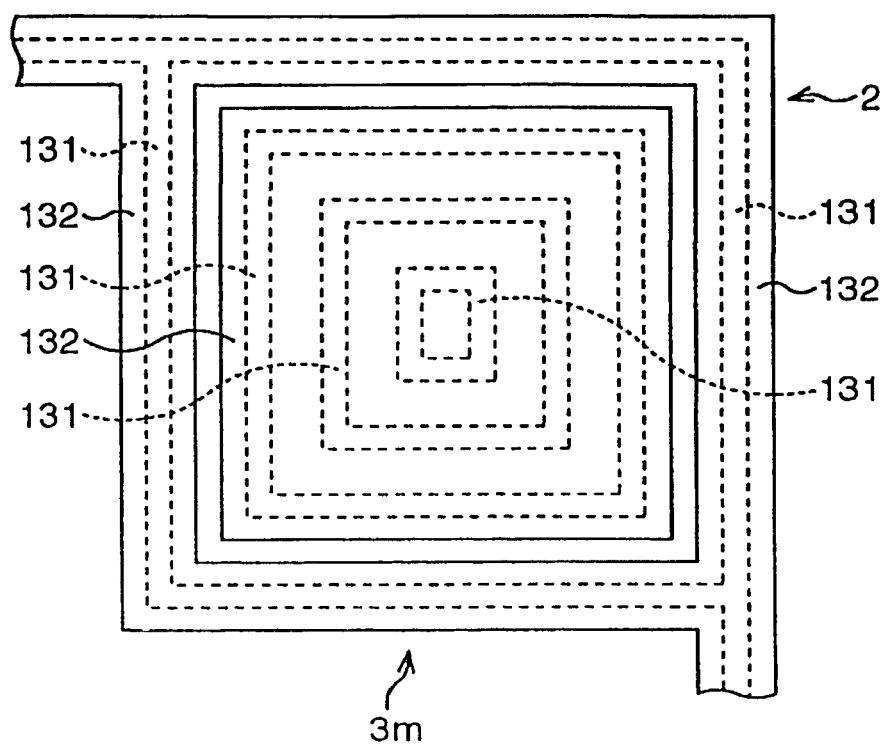
FIG. 17 is a layout showing the structure of wall parts of a semiconductor device according to a thirteenth embodiment of the present invention.

Next, a thirteenth embodiment of the present invention will be explained. FIG. 17 is a layout showing the structure of wall parts of a semiconductor device according to the thirteenth embodiment of the present invention.

According to the thirteenth embodiment, the structure of a sub-wall part is different from that of the twelfth embodiment. In concrete, as shown in FIG. 17, the wide trench 132 extends to the organic insulation film 117 and the silicon oxide film 118 which exist between the wall pieces 3d1 and 3d2 constituting the sub-wall part 3k of the twelfth embodiment, and further to the inside of the square-shaped region in the wall piece 3d2. The Ta film 119 and the metal film 120a are embedded in the trench 132, to constitute a sub-wall part 3m.

According to the thirteenth embodiment as described above, it is also possible to obtain a higher moisture resistance, similarly to the fifth to the twelfth embodiments.

-Method of Manufacturing Semiconductor Device-

Next, a method of manufacturing the semiconductor device according to the first embodiment will be explained. FIG. 18A to FIG. 18M are schematic sectional views showing the method of manufacturing the semiconductor device according to the first embodiment of the present invention in process order. Incidentally, only the region corresponding to the main wall part 2 will be illustrated in FIG. 18A to FIG. 18M.

First, the element isolation insulation film 102 is formed on the surface of the semiconductor substrate 101 in a state of a wafer by, for example, the LOCOS method, the STI method or the like. Thereafter, the gate insulation film 103, the gate electrode 104, the sidewall insulation film 105 and the source/drain diffusion layer 106 are formed in the integrated circuit part 1. Further, in the main wall part 2 and the sub-wall part 3, the diffusion layers 106a and 106b are selectively formed simultaneously with the formation of the source/drain diffusion layer 106. Next, the silicon nitride film 107 and the silicon oxide film 108 are formed over the entire surface by, for example, the plasma CVD method. The silicon nitride film 107 and the silicon oxide film 108 are, for example, 70 nm and 1000 nm in thickness, respectively. Next, the silicon oxide film 108 is flattened by, for example, the chemical mechanical polishing (CMP), thereby eliminating the difference in levels. After this processing of flattening, the silicon oxide film 108 is, for example, 700 nm in thickness. Thereafter, a photoresist 201 is applied onto the silicon oxide film 108, and the photoresist 201 is exposed and developed. Thereby, a pattern 201a for forming the contact hole in the integrated circuit part 1 and the narrow trenches 131 and 133 in the main wall part 2 and the sub-wall part 3 is formed in the photoresist 201. Incidentally, as to the resistance value measuring part 4, the element isolation insulation film may be formed on the surface of the semiconductor substrate 101 over the entire region of the resistance value measuring part 4, simultaneously with the formation of the element isolation insulation film 102, for example. Alternatively, the element isolation insulation film may be formed on the surface of the semiconductor substrate 101 only in the region where the electrodes 5a and 5b are to be formed.

Figure 18A:
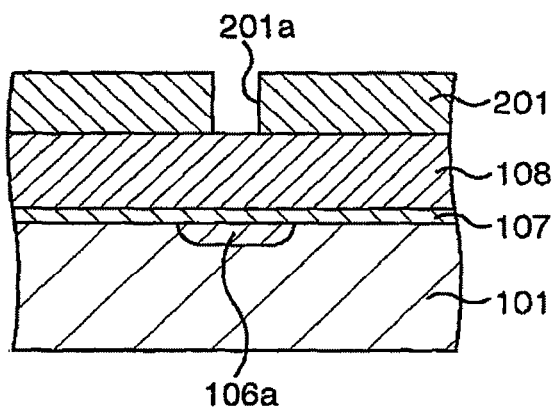
FIG. 18A to FIG. 18M are schematic sectional views showing a method of manufacturing the semiconductor device according to the first embodiment of the present invention in process order.
Figure 18B:
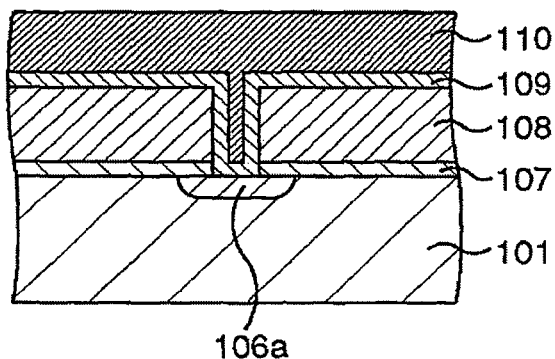

Subsequently, as shown in FIG. 18B, by using the photoresist 201 as a mask, the silicon oxide film 108 and the silicon nitride film 107 are subjected to anisotropic etching using a CF group gas. Thereby, the contact hole is formed in the integrated circuit part 1, and the narrow trenches 131 and 133 are formed in the main wall part 2, the sub-wall part 3 and the resistance value measuring part 4. Thereafter, the photoresist 201 is removed, and the TiN film 109 is formed as the glue layer in the contact hole, the narrow trenches 131 and 133 and on the silicon oxide film 108 by, for example, the sputtering, the CVD method or the like. Further, the W film 110 is formed on the TiN film 109 by, for example, the CVD method or the like. The TiN film 109 is, for example, 50 nm in thickness, and the W film 110 is, for example, 400 nm in thickness. Then, the TiN film 109 and the W film 110 on the silicon oxide film 108 are removed by the CMP method or the like, so that the TiN film 109 and the W film 110 remain only in the contact hole and the narrow trenches 131 and 133.

The case where damage is caused to the semiconductor substrate 101 during the etching of the silicon oxide film 108 and the silicon nitride film 107 or during the removal of the photoresist 201 is explained. First, an etching selection ratio between the silicon oxide film 108 and the silicon nitride film 107 is appropriately adjusted by adjusting process conditions such as a ratio of C quantity to F quantity of the CF type gas, a ratio of C quantity to H quantity, flow volumes of $O_2$ gas and Ar gas, a total pressure, partial pressure ratio, temperature, plasma power, substrate potential and the like. Then, only the silicon oxide film 108 is subjected to the etching. Next, the photoresist 201 is removed by the ashing using $O_2$, and thereafter, the silicon nitride film 107 may be subjected to the etching under the condition where the damage to the semiconductor substrate 101 is unlikely to be caused.

Figure 18C:
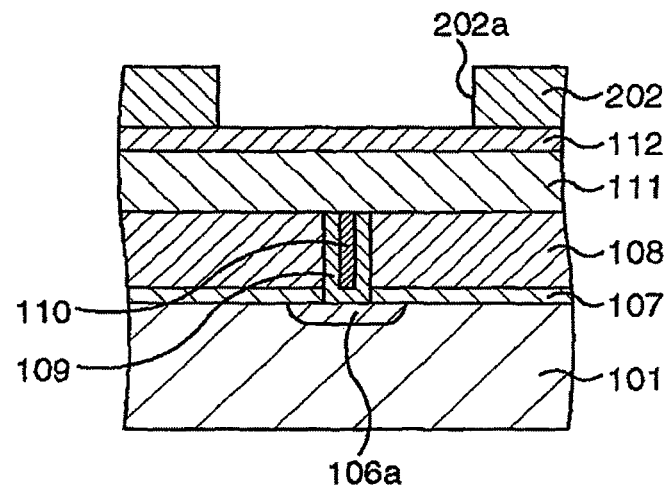

After removing the unnecessary TiN film 109 and the W film 110, as shown in FIG. 18C, an organic insulation film material is applied by, for example, the spin coating over the entire surface. Then, the organic insulation film material undergoes heat treatment which is suitable for this material, for example, the heat treatment at 400° C. for 60 minutes. Thereby, the organic insulation film material is hardened and the organic insulation film 111 is formed. Further, the silicon oxide film 112 is formed on the organic insulation film 111. Both of the organic insulation film 111 and the silicon oxide film 112 are, for example, 250 nm in thickness. Thereafter, a photoresist 202 is applied onto the silicon oxide film 112, and the photoresist 202 is exposed and developed. Thereby, a pattern 202a for forming the trench 135 for the wire in the integrated circuit part 1 and the wide trenches 132 and 134 in the main wall part 2, the sub-wall part 3 and the resistance value measuring part 4 is formed in the photoresist 202.

Figure 18D:
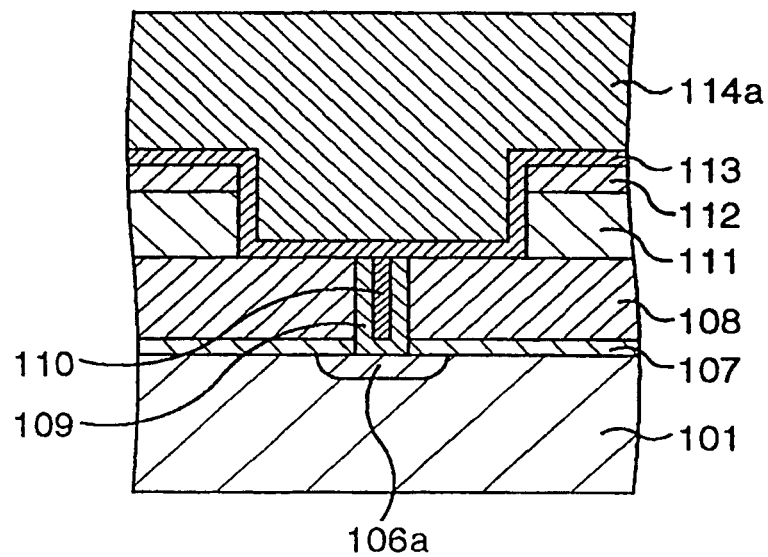

Subsequently, as shown in FIG. 18D, the silicon oxide film 112 is subjected to the anisotropic etching by using the photoresist 202 as a mask, and thereafter, the organic insulation film 111 is subjected to the etching using a mixed gas of $H_2$ and $N_2$. Thereby, the trench 135 is formed in the integrated circuit part 1, and the wide trenches 132 and 134 are formed in the main wall part 2, the sub-wall part 3 and the resistance value measuring part 4. At this time, the photoresist 202 is removed together with the organic insulation film 111, but the silicon oxide film 112 which exists underneath thereof is not subjected to the etching. Next, the Ta film 113 is formed as the barrier metal film in the trenches 135, 132 and 134 and on the silicon oxide film 112 by, for example, the sputtering or the like. Further, a film for wire material to become the wire 114 and the metal film 114a, for example, the Cu film, is formed on the Ta film 113 by, for example, the plating method or the like. It should be noted that, when the film for wire material is formed by the plating method, it is preferable to form a seed layer after forming the Ta film 113 by the sputtering, and thereafter, to form the film for wire material. The Ta film 113 is, for example, 30 nm in thickness and the film for wire material is, for example, 1800 nm in thickness.

Figure 18E:
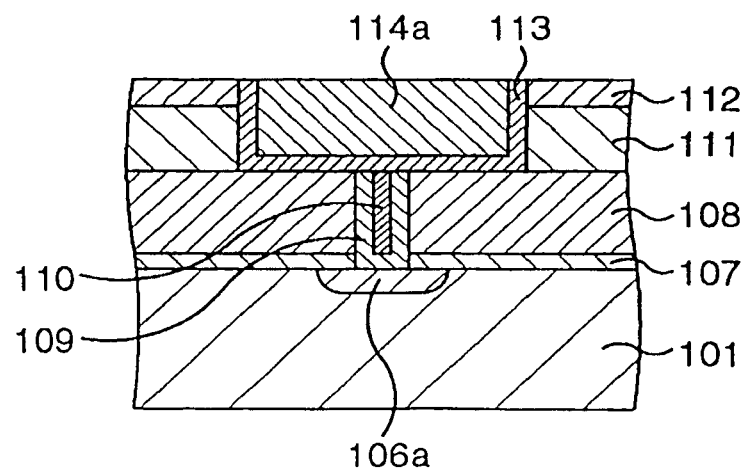

Subsequently, the Ta film 113 and the film for wire material on the silicon oxide film 112 are removed by the CMP method or the like, so that the Ta film 113 and the film for wire material remain only in the trenches 135, 132 and 134. As a result of this, as shown in FIG. 18E, the wire 114 and the metal film 114a are formed.

Figure 18F:
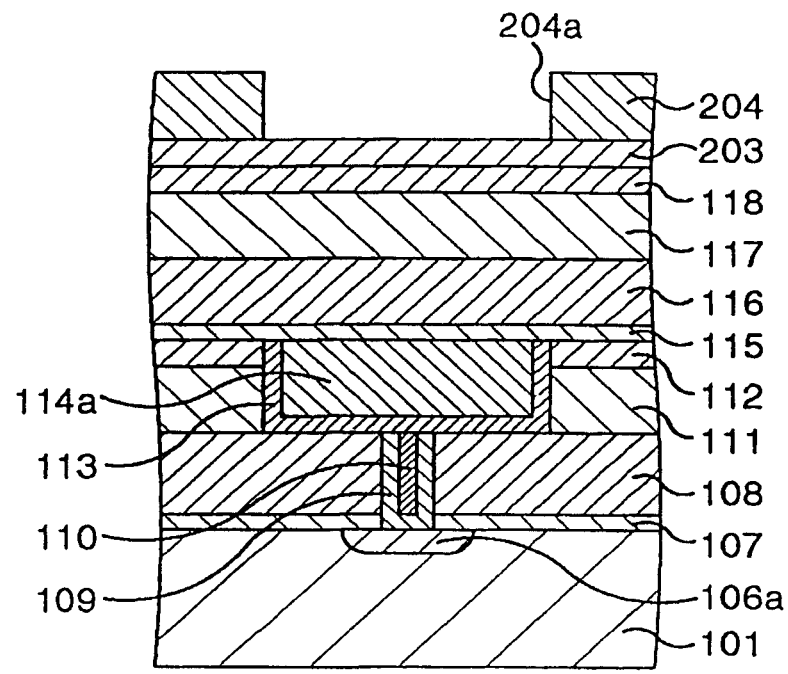

Then, as shown in FIG. 18F, the silicon nitride film 115 and the silicon oxide film 116 are formed over the entire surface in sequence. The silicon nitride film 115 is, for example, 50 nm in thickness, and the silicon oxide film 116 is, for example, 800 nm in thickness. The silicon nitride film 115 functions as an etching stopper film and a diffusion preventing film. Thereafter, the silicon oxide film 116 is flattened by, for example, the CMP, thereby eliminating the difference in levels. After this processing of flattening, the silicon oxide film 116 is, for example, 400 nm in thickness. Incidentally, the silicon oxide film 116 having the thickness of, for example, about 400 nm may be formed on the silicon nitride film 115 in order to omit the process of the CMP. Next, the organic insulation film 117 and the silicon oxide film 118 are formed on the silicon oxide film 116 in sequence. As described above, the organic insulation film 117 can be formed by applying, for example, the organic insulation film material by the spin coating, allowing the organic insulation film material to undergo the appropriate heat treatment and hardening the organic insulation film material. The organic insulation film 117 and the silicon oxide film 118 are, for example, 250 nm in thickness.

Thereafter, a metal film 203 which is used as a hard mask in forming the trench is formed on the silicon oxide film 118. The metal film 203 is, for example, the TiN film, and its thickness is, for example, 100 nm. Further, a photoresist 204 is applied on the metal film 203, and the photoresist 204 is exposed and developed. Thereby, a pattern 204a for forming the trench 137 in the integrated circuit part 1 and the wide trenches 132 and 134 in the main wall part 2, the sub-wall part 3 and the resistance value measuring part 4 is formed in the photoresist 204.

Figure 18G:
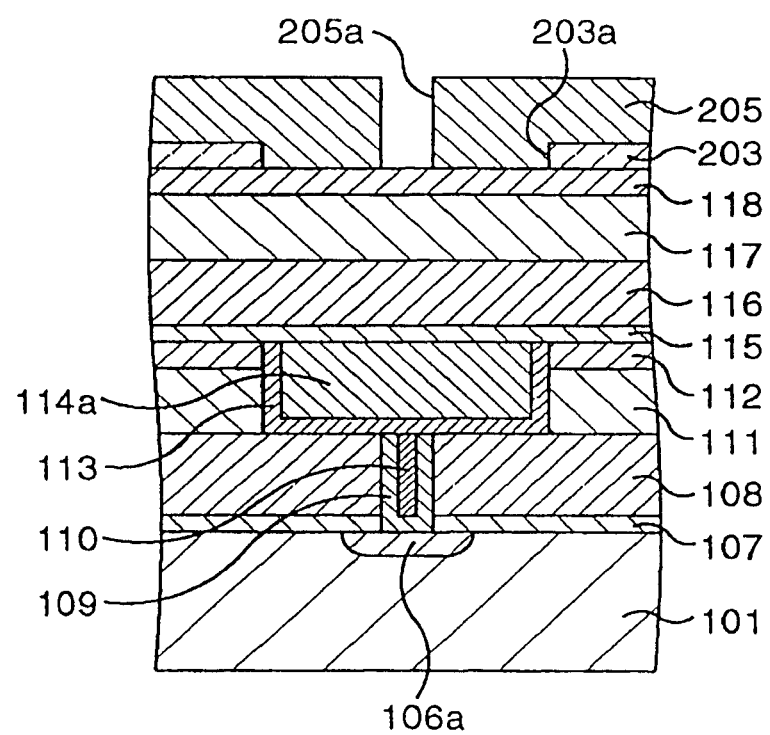

Subsequently, as shown in FIG. 18G, by using the photoresist 204 as a mask, the metal film 203 is subjected to the etching using a Cl type gas. Thereby, the pattern 204a is transferred to the metal film 203 to form a pattern 203a. Then, the photoresist 204 is removed by the ashing. Next, a photoresist 205 is applied over the entire surface, and the photoresist 205 is exposed and developed. Thereby, a pattern 205a for forming the contact hole 136 in the integrated circuit part 1 and the narrow trenches 131 and 133 in the main wall part 2, the sub-wall part 3 and the resistance value measuring part 4 is formed in the photoresist 205.

Figure 18H:
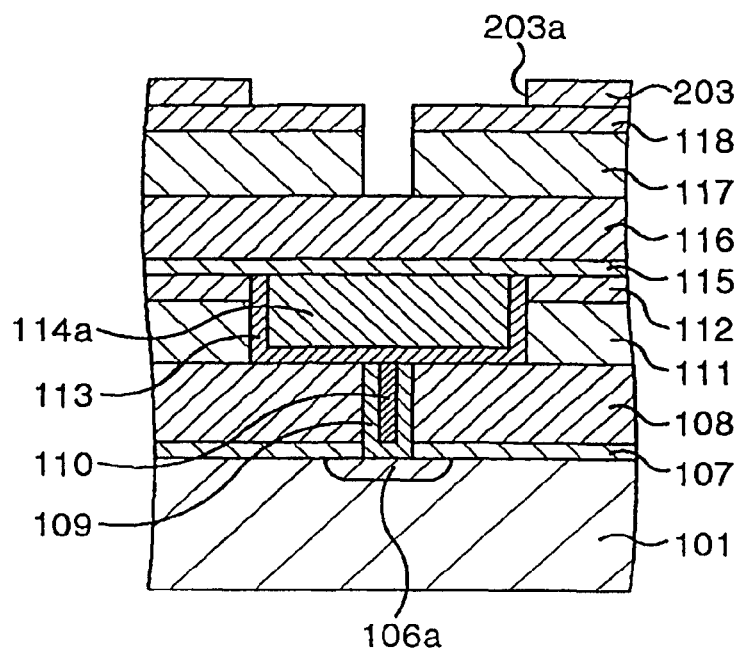
Figure 18I:
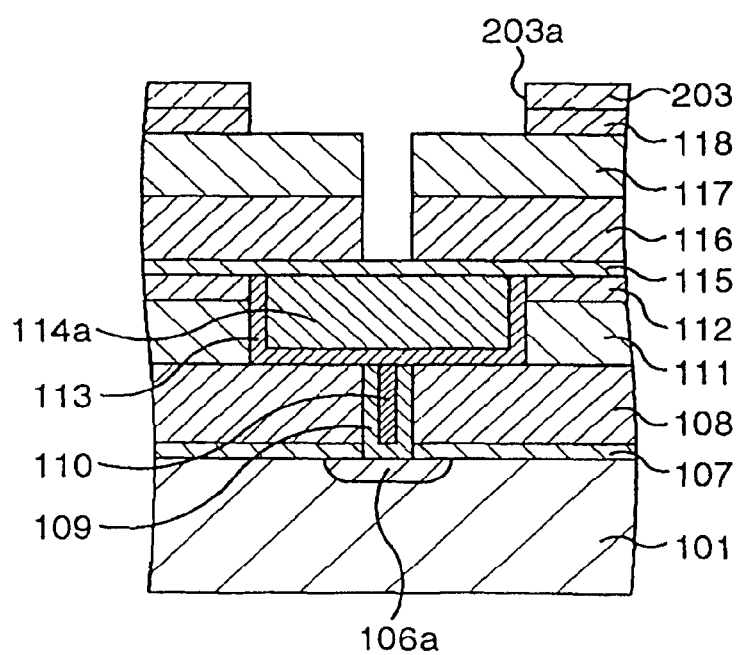

Subsequently, as shown in FIG. 18H, the silicon oxide film 118 is subjected to the etching by using the photoresist 205 as a mask. Further, by using the silicon oxide film 118 as a mask, the organic insulation film 117 is subjected to the etching using a mixed gas of $H_2$ and $N_2$, thereby forming the contact hole 136 in the integrated circuit part 1 and the narrow trenches 131 and 133 in the main wall part 2, the sub-wall part 3 and the resistance value measuring part 4. At this time, the photoresist 205 is removed together with the organic insulation film 117, but the metal film 203 and the silicon oxide film 118 which exist underneath thereof are not subjected to the etching. It should be noted that, if displacement is caused in forming the pattern 203a in the metal film 203, it is preferable to remove the unnecessary part of the metal film 203 using the photoresist 205 as a mask before the etching of the silicon oxide film 118.

Figure 18J:
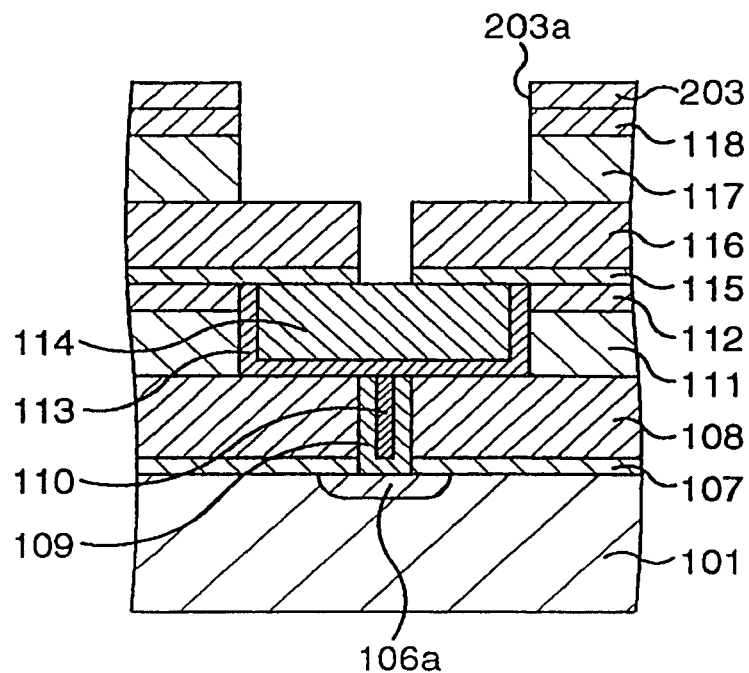

Subsequently, as shown in FIG. 18J, the silicon oxide films 118 and 116 are subjected to the etching by using the metal film 203 and the organic insulation film 117 as masks. As a result of this, the pattern 203a is transferred to the silicon oxide film 118, and the patterns formed in the silicon oxide film 118 and the organic insulation film 117 are transferred to the silicon oxide film 116. At this time, the etching of the silicon oxide film 118 stops on the organic insulation film 117, and the etching of the silicon oxide film 116 stops on the silicon nitride film 115, which functions as the etching stopper film.

Subsequently, as shown in FIG. 18J, the organic insulation film 117 is subjected to the anisotropic etching using the metal film 203 and the silicon oxide film 118 as masks. Thereafter, the silicon nitride film 115 is subjected to the anisotropic etching using the silicon oxide film 116 as a mask. Consequently, the contact hole 136 and the trench 137 are formed in the integrated circuit part 1, the trenches 131 and 133 are formed in the main wall part 2 and the sub-wall part 3, and the trenches 132 and 134 are formed in the resistance value measuring part 4. Incidentally, the anisotropic etching of the organic insulation film 117 may be carried out after the anisotropic etching of the silicon nitride film 115.

Figure 18K:
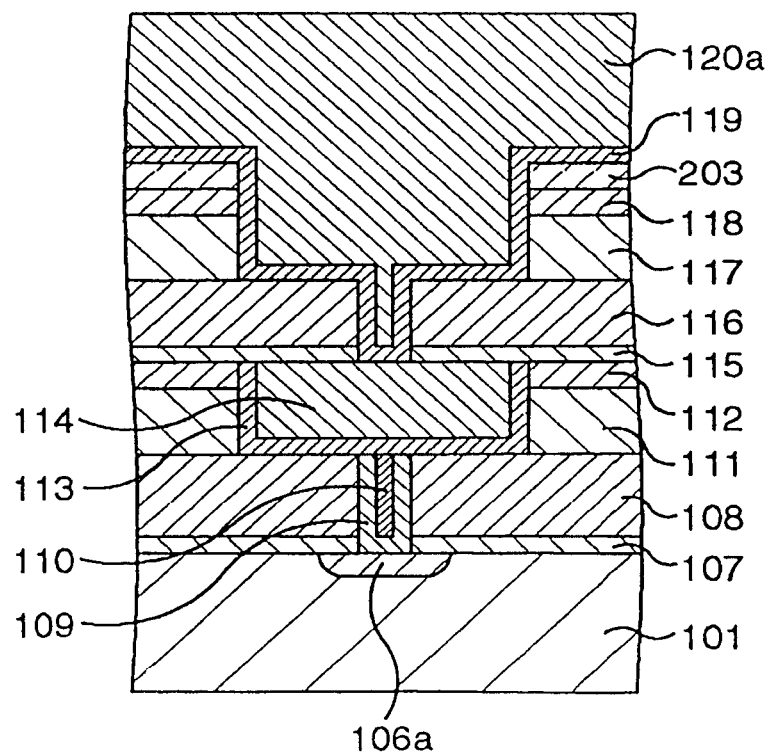

Subsequently, as shown in FIG. 18K, the Ta film 119 is formed as the barrier metal film in the trenches 131 to 135, the contact hole 136 and on the metal film 203 which come to the surface by, for example, the sputtering or the like. Further, a film for wire material to become the wire 120 and the metal film 120a, for example, a Cu film, is formed on the Ta film 119 by, for example, the plating method or the like. It should be noted that, when the film for wire material is formed by the plating method, it is preferable to form a seed layer after forming the Ta film 119 by the sputtering, and thereafter, to form the film for wire material. The Ta film 119 is, for example, 30 nm in thickness and the film for wire material is, for example, 1800 nm in thickness.

Figure 18L:
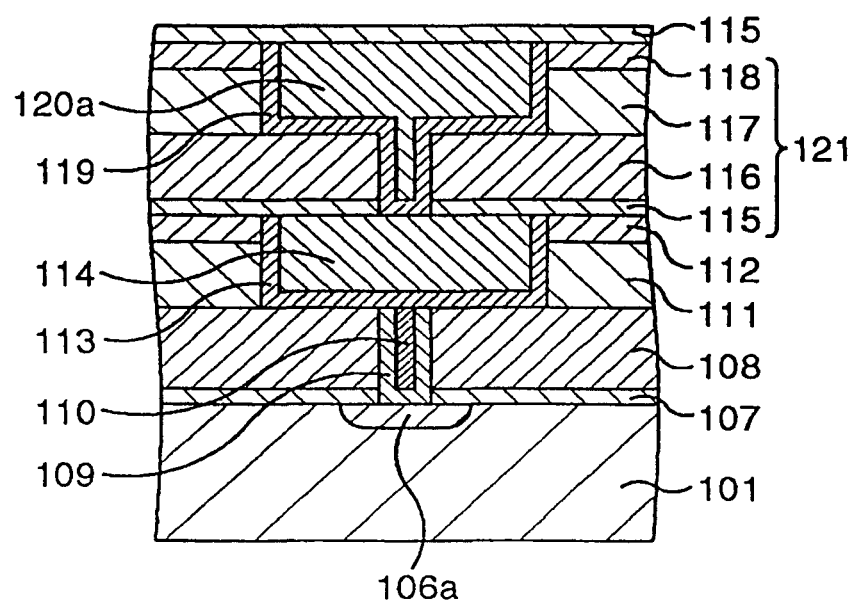

Subsequently, the metal film 203, the Ta film 119 and the film for wire material on the silicon oxide film 118 are removed by the CMP method or the like, so that the Ta film 119 and the film for wire material remain only in the trenches 131 to 135 and in the contact hole 136 which came to the surface. As a result of this, as shown in FIG. 18L, the metal film 120a is formed in the main wall part 2, the sub-wall part 3, and the resistance value measuring part 4, and the wire 120 (not shown in FIG. 18L) is formed in the integrated circuit part 1. Next, the silicon nitride film 115 is formed again over the entire surface, and the process shown in FIG. 18F to the process shown in FIG. 18L are repeated for a predetermined number of times.

Figure 18M:
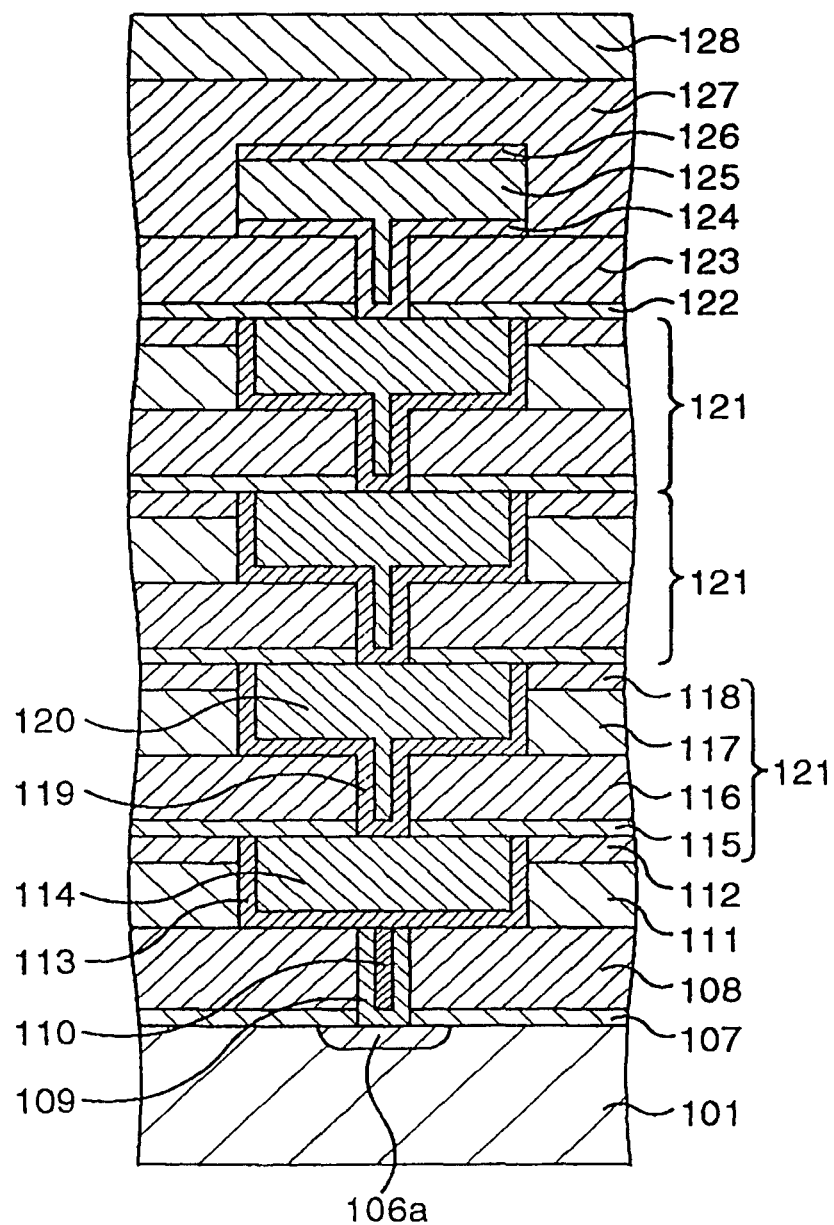

Then, as shown in FIG. 18M, after forming the uppermost basic structural bodies 121 and 121a, the silicon nitride film 122 and the silicon oxide film 123 are formed over the entire surface. Thereafter, the trenches 131 and 133 and the contact hole 138 are formed in the silicon oxide film 123 and the silicon nitride film 122 using a photoresist (not shown) in which a predetermined pattern is formed. Next, the barrier metal film 124 and the Al film 125 are formed in the trenches 131 and 133, the contact hole 138 and on the silicon oxide film 123, and further, the barrier metal film 126 is formed on the Al film 125. Next, the barrier metal film 126, the Al film 125 and the barrier metal film 124 are patterned into predetermined shapes, on which the silicon oxide film 127 is formed over the entire surface. Then, the silicon nitride film 128 is formed on the silicon oxide film 127 as the coating film.

Figure 19:
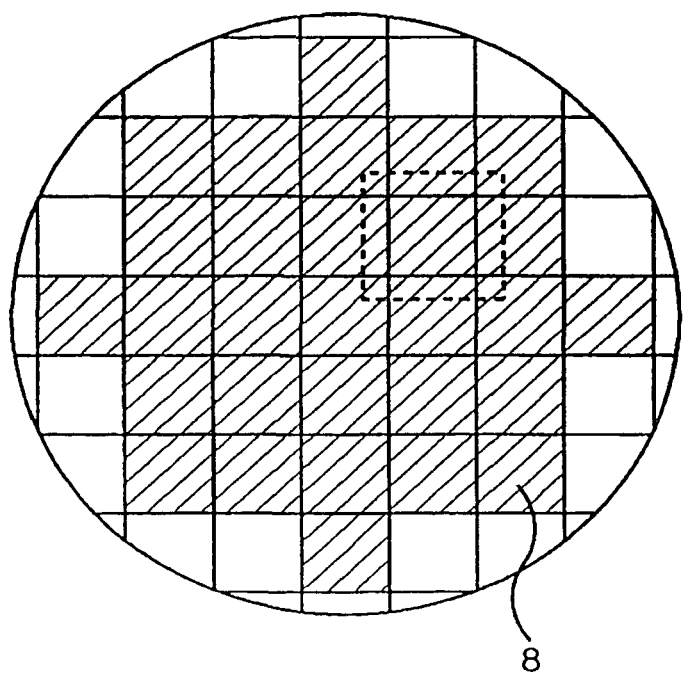
FIG. 19 is a plane view showing a wafer after pads are formed.
Figure 20:
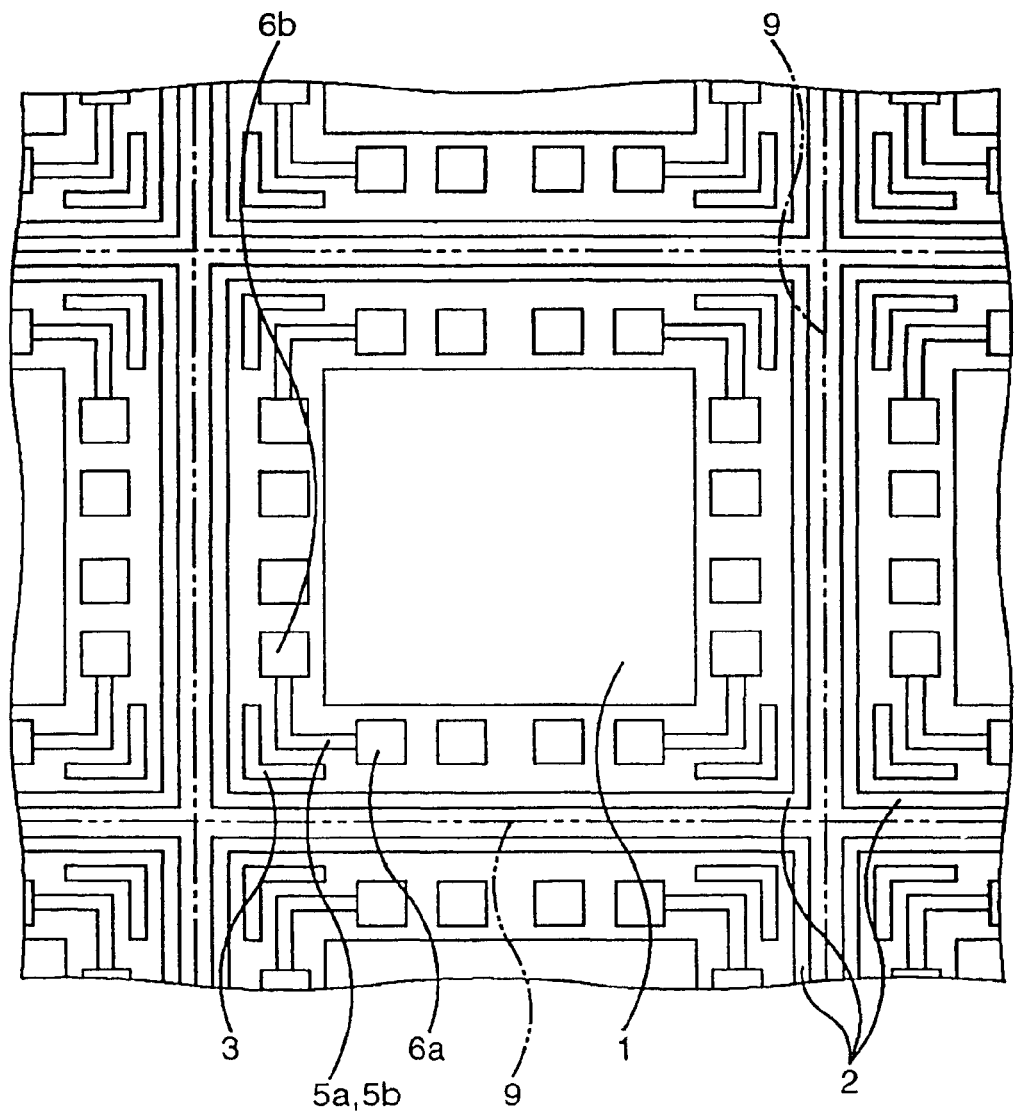
FIG. 20 is a layout showing a region shown by the broken line in FIG. 19 by enlarging the region.

Thereafter, openings are formed at predetermined positions in the silicon nitride film 128 and the silicon oxide film 127, thereby selectively exposing the barrier metal film 126. Further, the exposed barrier metal film 126 is subjected to the etching, thereby exposing the Al film 125. This exposed portions become the monitor pads for checking to secure moisture resistance 6a and 6b and the evaluation pads 7. FIG. 19 is a plane view showing the wafer after the pads are formed, and FIG. 20 is a layout showing a region shown by the broken line in FIG. 19 by enlarging the region. When the monitor pads for checking to secure moisture resistance 6a and 6b and the evaluation pads 7 are formed, there exists effective chip regions 8 (the region shown by the hatching in FIG. 19) which is spaced from a periphery of the wafer by a fixed distance or more. Thereafter, the effective chip region 8 is diced along cutting lines 9 which are center lines between the adjacent main wall parts 2, thereby dicing the wafer into a plurality of chips.

Thus, it is possible to manufacture the semiconductor device according to the first embodiment.

Note that, when manufacturing the semiconductor devices according to the second to the thirteenth embodiments, it is suitable to change the patterns for forming the sub-wall part 3 and the resistance value measuring part 4.

-Fourteenth Embodiment-

In the method of manufacturing the semiconductor device described above, a phase shift mask of, for example, a halftone type is used in patterning a photoresist.

Figure 30A:
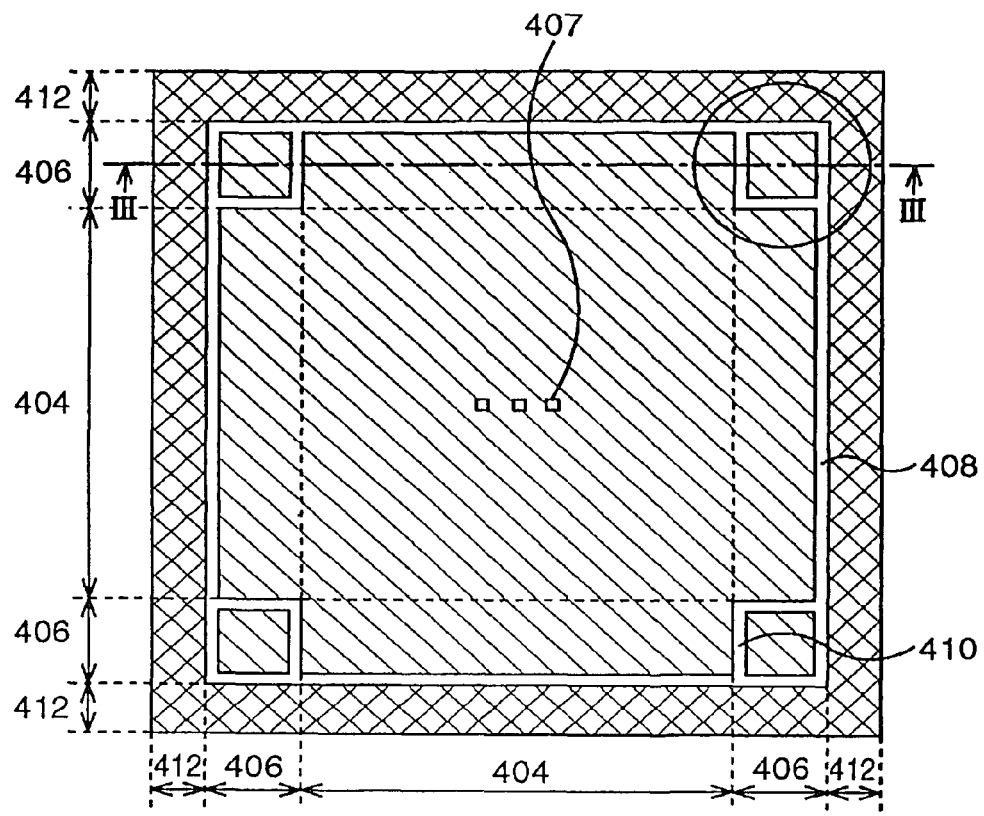
FIG. 30A and FIG. 30B are a plan view and a cross sectional view showing a phase shift mask.
Figure 30B:
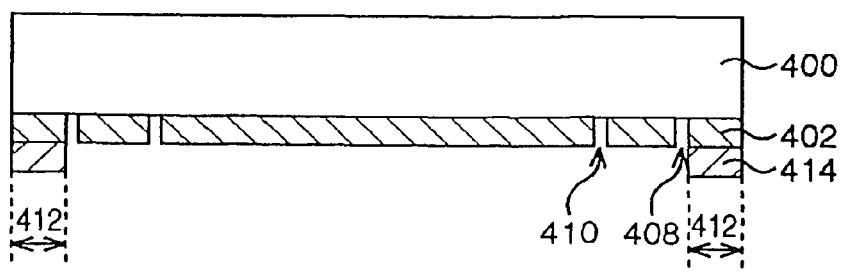

The halftone phase shift mask will be explained using FIG. 30A and FIG. 30B. FIG. 30A and FIG. 30B are a plan view and a cross sectional view showing a phase shift mask. FIG. 30A is a plan view and FIG. 30B is a cross sectional view taken along the III-III line in FIG. 30A.

As shown in FIG. 30A and FIG. 30B, a translucent phase shifter film 402 is formed on a transparent substrate 400. As the phase shifter film 402, for example, one which shifts the phase of lights transmitting therethrough by 180 degrees is used.

In an integrated circuit region 404 with which an integrated circuit part is to be formed, the phase shifter film 402 has contact hole patterns 407 formed therein. The contact hole patterns 407 are intended for forming contact holes.

In a peripheral edge region 406 with which a peripheral edge part in the periphery of the integrated circuit part is to be formed, the phase shifter film 402 has a main wall part pattern 408 and a sub-wall part pattern 410 formed therein. The main wall part pattern 408 is a pattern for forming the main wall part 2 (refer to FIG. 1). The sub-wall part pattern 410 is a pattern for forming the sub-wall part 3 (refer to FIG. 1).

In a scribe line region 412, a light shield film 414 is formed on the phase shifter film 402. Note that the scribe line region 412 is a region where adjacent shots overlap each other on a wafer when transfer and exposure are subsequently conducted using a stepper (multiple exposure region).

The halftone phase shift mask is thus structured.

The use of the halftone phase shift mask causes a phase difference of 180 degrees between a light passing through the phase shifter film 402 and a light passing through a transmitting region so that the contrast in the vicinity of a pattern edge can be enhanced due to interference of light. This enables microscopic formation of the integrated circuit part.

In a general halftone phase shift mask, however, when a plurality of patterns are adjacent to one another, an undesirable abnormal pattern called a side lobe is sometimes generated in the vicinity of these patterns. This is a problem peculiar to the halftone phase shift mask. The side lobe is generated by mutual interference of lights passing through a pattern constituted of the translucent phase shifter film. Since the main wall part pattern 408 and the sub-wall part pattern 410 are formed to be linear, the exposure amount therein is larger compared with that in the contact hole patterns 407. Accordingly, the side lobe is liable to occur in the vicinity of the main wall part and the sub-wall part.

Figure 31:
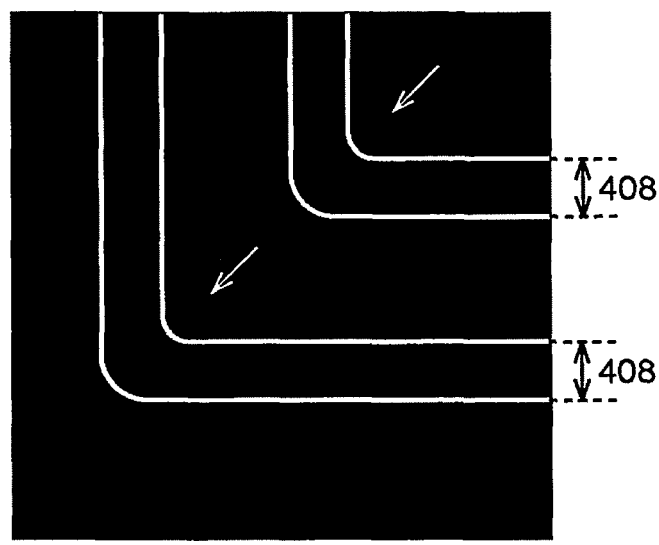
FIG. 31 is a view showing a side lobe (No. 1)
Figure 32:
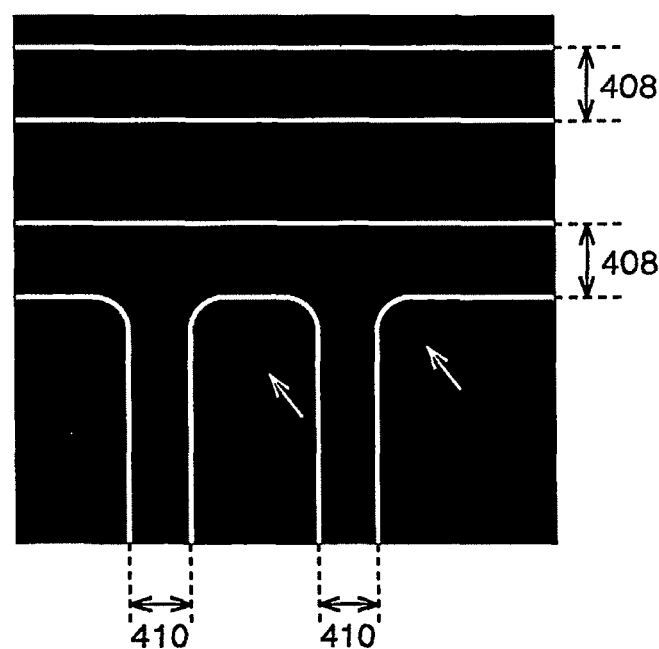
FIG. 32 is a view showing a side lobe (No. 2).

A side lobe which is generated when the exposure is conducted using the halftone phase shift mask shown in FIG. 30A and FIG. 30B will be explained using FIG. 31 and FIG. 32. FIG. 31 is a view showing a side lobe (No. 1). FIG. 32 is a view showing a side lobe (No. 2).

As shown by the arrows in FIG. 31 and FIG. 32, side lobes are generated in the vicinity of a part having an L-shaped pattern and a part having a T-shaped pattern. Further, a side lobe is sometimes generated also in a part having a linear shaped pattern, though not shown.

Meanwhile, Japanese Patent Laid-open No. 8-279452 discloses a technique for preventing the generation of the side lobe by forming a dummy opening region. When the technique described in the reference is used, however, optimization is necessary every time lighting conditions and so on of photolithography are varied, which requires an enormous amount of work. Further, in the technique described in the reference, it is extremely difficult to prevent a side lobe generated in a part having a linear pattern.

After assiduous studies, the inventors of the present invention have found out that the use of a phase shift mask as structured below makes it possible to manufacture the aforesaid semiconductor device while preventing the occurrence of the side lobe.

Figure 23A:
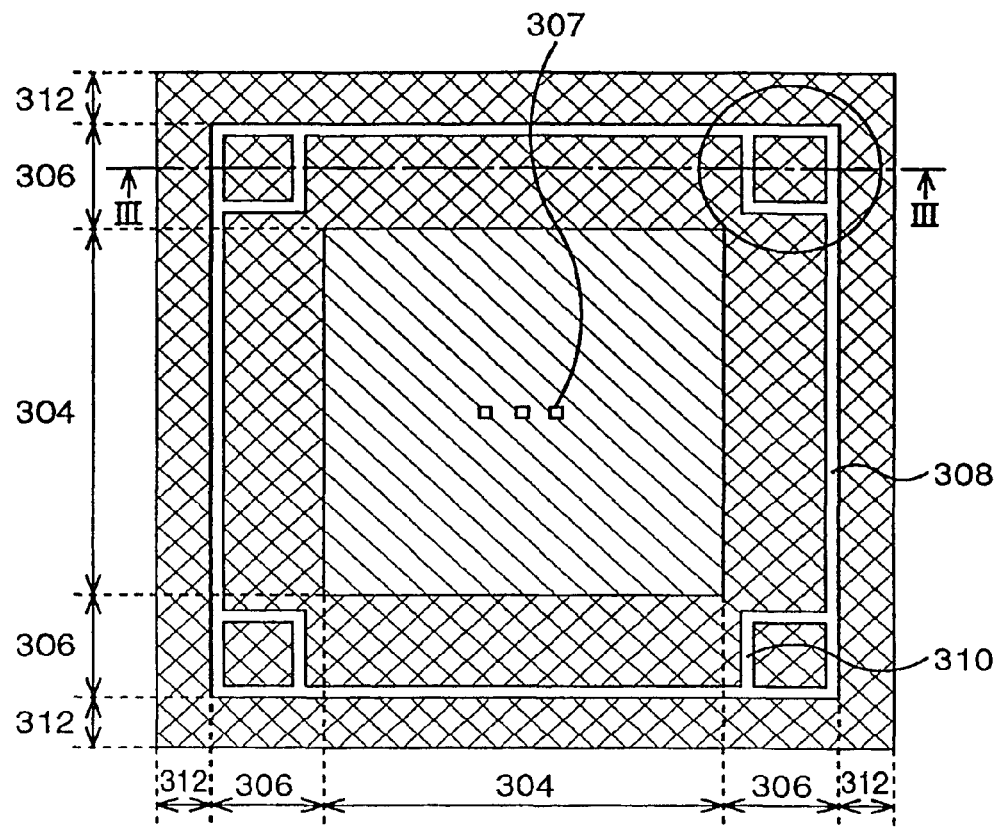
FIG. 23A and FIG. 23B are a plan view and a cross sectional view showing a phase shift mask according to a fourteenth embodiment of the present invention.
Figure 23B:
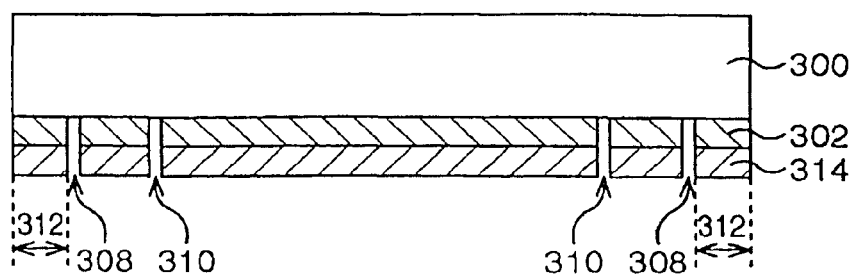
Figure 24A:
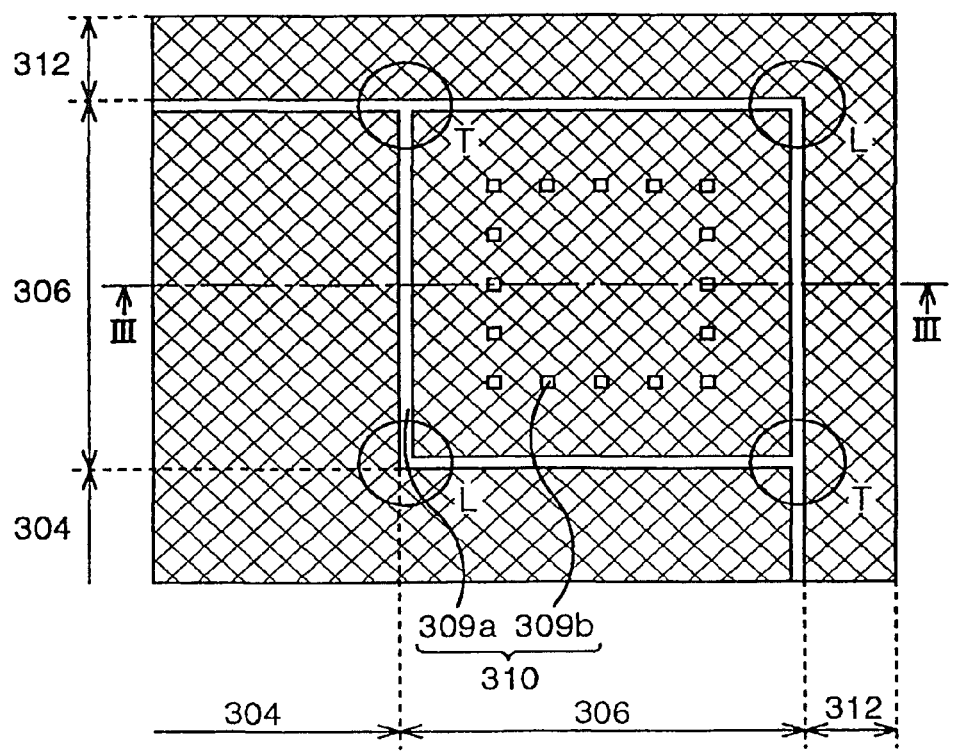
FIG. 24A and FIG. 24B are enlarged views showing the phase shift mask according to the fourteenth embodiment of the present invention.
Figure 24B:
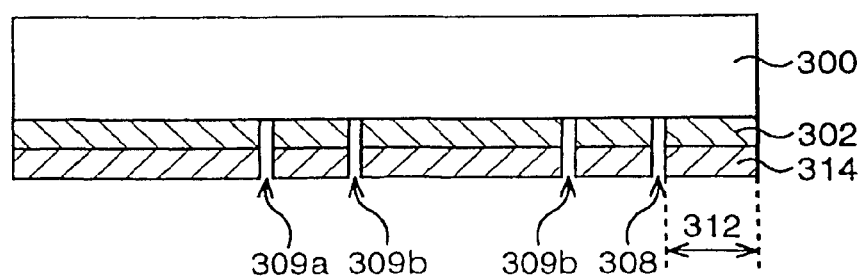

A phase shift mask according to a fourteenth embodiment of the present invention will be explained using FIG. 23A, FIG. 23B, FIG. 24A, and FIG. 24B. FIG. 23A and FIG. 23B are a plan view and a cross sectional view showing the phase shift mask according to this embodiment. FIG. 23A is a plan view and FIG. 23B is a cross sectional view taken along the III-III line in FIG. 23A. FIG. 24A and FIG. 24B are enlarged views showing the phase shift mask according to this embodiment. FIG. 24A and FIG. 24B show enlarged views of a circled region in FIG. 23A. FIG. 24A is a plan view and FIG. 24B is a cross sectional view taken along the III-III line in FIG. 24A. Though in FIG. 23A and FIG. 23B, a part of wall part piece patterns 309b (refer to FIG. 24A and FIG. 24B) are omitted, the wall part piece patterns 309b omitted in FIG. 23A and FIG. 23B are also shown in FIG. 24A and FIG. 24B. The same reference numerals and symbols are used to designate the same constituent elements as those of the semiconductor devices and the method of manufacturing the same according to the first to thirteenth embodiments shown in FIG. 1 to FIG. 22, and the explanation thereof will be omitted or simplified.

A phase shift mask used in patterning the photoresist 201 shown in FIG. 18A will be taken for example to explain this embodiment. Specifically, a phase shift mask used in forming, in the photoresist 201, the pattern 201a and so on for forming the contact holes reaching the source/drain diffusion layer 106 (refer to FIG. 2) and the trenches 131 (refer to FIG. 1) reaching the diffusion layer 106a (refer to FIG. 3) will be taken for example to explain this embodiment.

In this embodiment, the phase shift mask for patterning the photoresist 201 shown in FIG. 18A will be taken for example for explanation, but the principle of the present invention is applicable to a phase shift mask for patterning all the other photoresists such as the photoresist 202 (refer to FIG. 18C), the photoresist 204 (refer to FIG. 18F), the photoresist 205 (refer to FIG. 18G), and the like.

As shown in FIG. 23A and FIG. 23B, a phase shifter film 302 is formed on a transparent substrate 300. As a material of the phase shifter film 302, for example, a material whose light transmittance is about 4% to about 30% and which shifts the phase of a light by 180 degrees is usable. More specifically, as the material of the phase shifter film 302, for example, MoSi (molybdenum silicide) or the like is usable.

In an integrated circuit region 304 in which integrated circuit part is to be formed, namely, in a main region, the phase shifter film 302 has contact hole patterns 307 formed therein. The contact hole patterns 307 are patterns for forming contact holes as described above.

In a peripheral edge region 306 in which peripheral edge part in the periphery of the integrated circuit part is to be formed, the phase shifter film 302 has a main wall part pattern 308 and a sub-wall part pattern 310 formed therein. The main wall part pattern 308 is a pattern for forming the main wall part 2 (refer to FIG. 1) as described above. The sub-wall part pattern 310 is a pattern for forming the sub-wall part 3 (refer to FIG. 1) as described above.

As shown in FIG. 24A and FIG. 24B, the sub-wall part pattern 310 is constituted of a wall part piece pattern 309a and wall part piece patterns 309b. The wall part piece pattern 309a on the outer side is formed in an L shape as a whole. The plurality of wall part piece patterns 309b on the inner side are formed. The shape of each of the wall part piece patterns 309b on the inner side approximates that of the contact hole pattern 307. The plural wall part piece patterns 309b are arranged in a "square" shape as a whole. Incidentally, the plural wall part piece patterns 309b arranged in the "square" shape as a whole are arranged in a single square here, but the arrangement of the plural wall part piece patterns 309b arranged in the "square" shape as a whole is not limited to a single square and may be arranged in a two squares or more. The wall part piece pattern 309a on the outer side is connected to the main wall part pattern 308. Portions where the main wall part pattern 308 and the wall part piece pattern 309a of the sub-wall part pattern 310 are connected to each other are formed in a T-shaped pattern.

In a scribe line region 312, a light shield film 314 consisting of, for example, Cr is formed.

The light shield film 314 is formed also in the peripheral edge region 306. The reason for forming the light shield film 314 also in the peripheral edge region 306 in this embodiment is explained as follows. The light shield film 314 prevents lights from passing through the phase shifter film 302 so that the occurrence of the interference of the lights in the peripheral edge region 306 can be reduced. This enables the prevention of the occurrence of the side lobe in the peripheral edge region 306. As shown in FIG. 23A and FIG. 23B, the light shield film 314 is formed so as to cover a range extending to, for example, about 1 μm to about 5 μm inward from corners of the sub-wall part pattern 310.

The size of patterns formed in the peripheral edge region 306 is relatively larger than the size of patterns formed in the integrated circuit region 304. The patterns formed in the peripheral edge region 306 include, besides the main wall part pattern 308 and the sub-wall part pattern 310, contact hole patterns (not shown) and so on. The reason for making the size of the patterns in the peripheral edge region larger than the size of the patterns in the integrated circuit region is explained as follows. Namely, in a region where the phase shifter film 304 is not covered with the light shield film 314, a high resolution is obtained to enable the formation of a microscopic sized opening while, on the other hand, the region where the phase shifter film 302 is covered with the light shield film 314 has a low resolution so that it is difficult to form a microscopic sized opening. Consequently, the width of the main wall part 2 (refer to FIG. 1) and the sub-wall part 3 (refer to FIG. 1) is, for example, about 0.2 μm to about 10 μm on a wafer which is an image plane, and the diameter of a contact hole (not shown) of the integrated circuit part 1 (refer to FIG. 1) is, for example, about 0.1 μm to about 0.3 μm on the wafer which is the image plane. Note that these sizes, which are sizes on the wafer as the image plane, become five times as large on the phase shift mask when the reduction ratio is one fifth, and four times as large on the phase shift mask when the reduction ratio is one fourth.

Thus, the halftone phase shift mask according to this embodiment is structured.

The main characteristic of the phase shift mask according to this embodiment lies in that the light shield film 314 is formed also in the peripheral edge region 306 as described above.

When the phase shift mask shown in FIG. 30A and FIG. 30B is used, lights passing through the phase shifter film 302 interfere with each other in the vicinity of the main wall part and the sub-wall part to generate the side lobe in the vicinity of the main wall part and the sub-wall part.

In this embodiment, on the other hand, the light shield film 314 is formed also in the peripheral edge region 306 so that the light shield film 314 can prevent lights from passing through the phase shifter film 302 in the peripheral edge region 306. Therefore, according to this embodiment, the mutual interference of the lights in the vicinity of the main wall part 2 and the sub-wall part 3 can be reduced to enable the prevention of the side lobe generation.

Moreover, since the light shield film 314 formed in the peripheral edge region 306 is the same film as the light shield film 314 formed in the scribe line region 312, the phase shift mask can be manufactured without increasing the number of manufacturing processes.

-Fifteenth Embodiment-

Figure 25A:
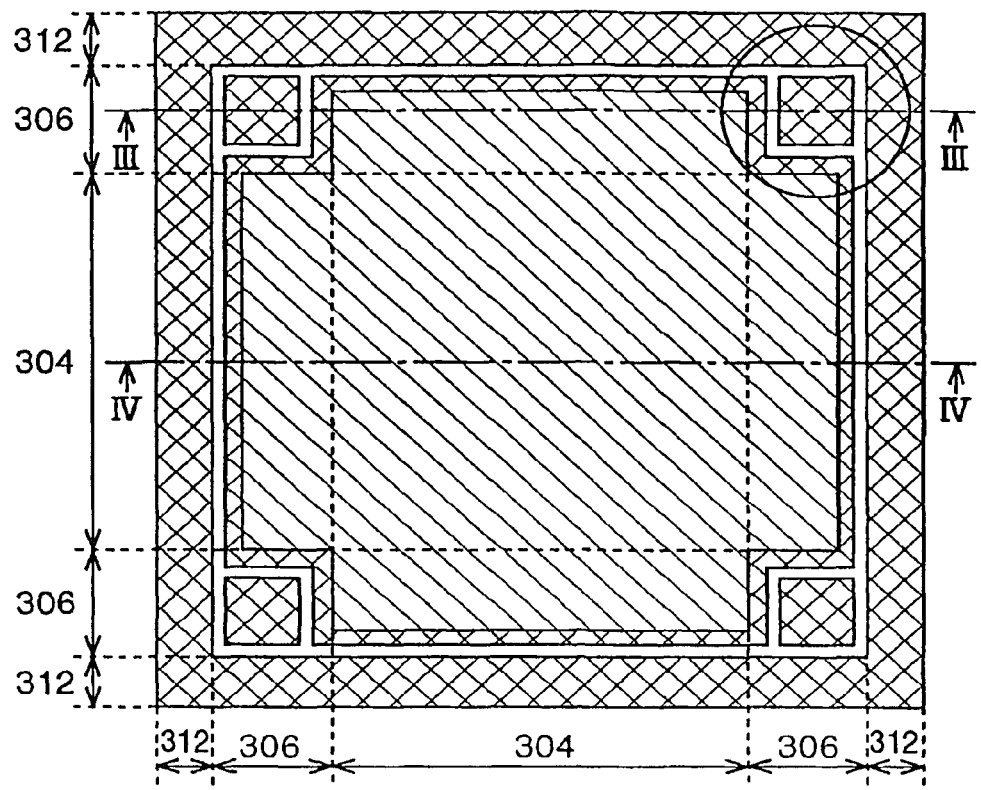
FIG. 25A to FIG. 25C are a plan view and cross sectional views showing a phase shift mask according to a fifteenth embodiment of the present invention.
Figure 25B:
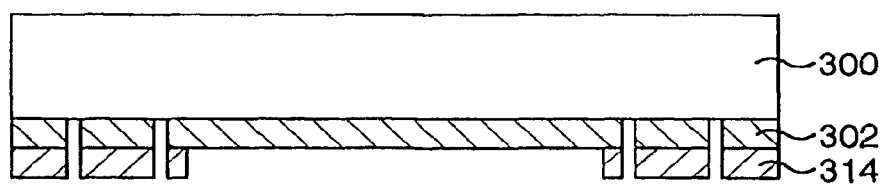
Figure 25C:
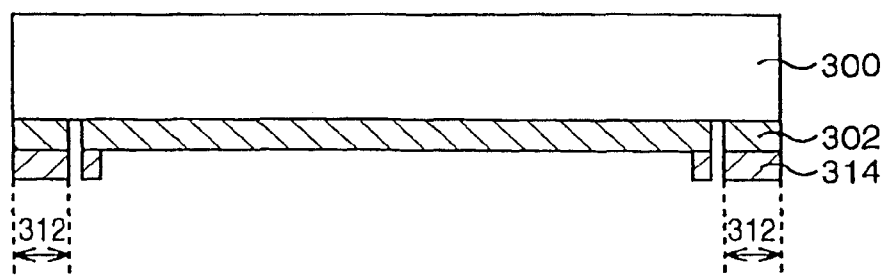
Figure 26A:
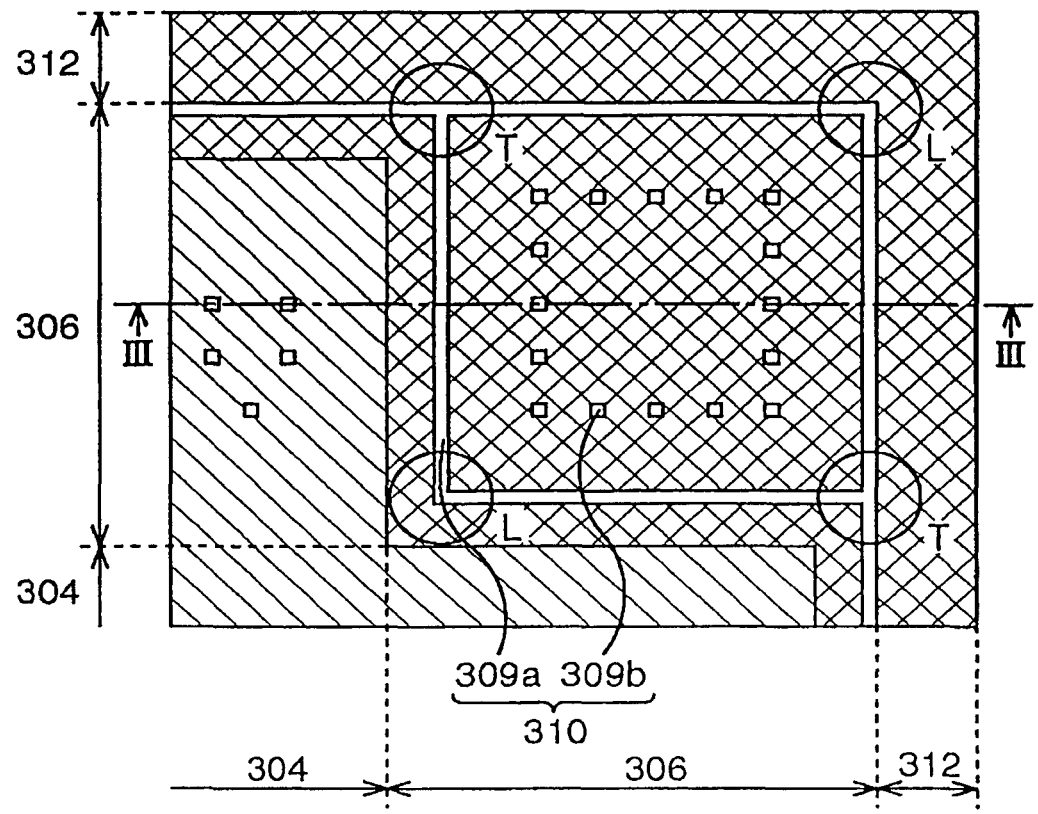
FIG. 26A and FIG. 26B are enlarged views showing the phase shift mask according to the fifteenth embodiment of the present invention.
Figure 26B:
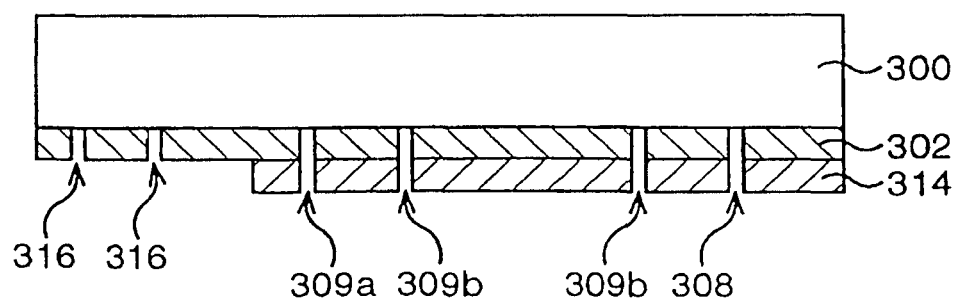

A phase shift mask according to a fifteenth embodiment of the present invention will be explained using FIG. 25A to FIG. 25C, FIG. 26A, and FIG. 26B. FIG. 25A to FIG. 25C are a plan view and cross sectional views showing the phase shift mask according to this embodiment. FIG. 25A is a plan view, FIG. 25B is a cross sectional view taken along the III-III line in FIG. 25A, and FIG. 25C is a cross sectional view taken along the IV-IV line in FIG. 25A. FIG. 26A and FIG. 26B are enlarged views showing the phase shift mask according to this embodiment. FIG. 26A and FIG. 26B show enlarged views of a circled part in FIG. 25A. FIG. 26A is a plan view and FIG. 26B is a cross sectional view taken along the III-III line in FIG. 26A. Though a part of the wall part piece patterns 309b (refer to FIG. 26A and FIG. 26B) is omitted in FIG. 25A to FIG. 25C, the wall part piece patterns 309b omitted in FIG. 25A to FIG. 25C are also shown in FIG. 26A and FIG. 26B. Further, though a part of contact hole patterns 316 (refer to FIG. 26A and FIG. 26B) is omitted in FIG. 25A to FIG. 25C, the contact hole patterns 316 omitted in FIG. 25A to FIG. 25C are also shown in FIG. 26A and FIG. 26B. The same reference numerals and symbols are used to designate the same constituent elements as those of the semiconductor devices, the method of manufacturing the same, and the phase shift mask according to the first to fourteenth embodiments shown in FIG. 1 to FIG. 24B, and the explanation thereof will be omitted or simplified.

The main characteristic of the phase shift mask according to this embodiment lies in that the light shield film 314 is selectively formed only in the vicinity of the main wall part pattern 308 and the sub-wall part pattern 310.

As shown in FIG. 25A to FIG. 25C, the light shield film 314 is selectively formed only in the vicinity of the main wall part pattern 308 and the sub-wall part pattern 310 in the peripheral edge region 306. The light shield film 314 is formed so as to cover a range extending to, for example, about 1 μm to about 5 μm inward from the edges of the main wall part pattern 308 and the sub-wall part pattern 310.

It should be noted that the range in which the light shield film 314 is formed is not limited to the range of 1 μm to 5 μm inward from the edges of the main wall part pattern 308 and the sub-wall part pattern 310. The range in which the light shield film 314 is formed may be appropriately set to such an extent that the side lobe generation can be prevented.

The light shield film 314 is not formed in regions of the peripheral edge region 306 except the vicinity of the main wall part pattern 308 and the sub-wall part pattern 310.

As shown in FIG. 26A and FIG. 26B, the contact hole patterns 316 are formed in the region of the peripheral edge region 306 where the light shield film 314 is not formed. The contact hole patterns 316 are patterns for forming contact holes (not shown) reaching a source/drain diffusion layer of MOS transistors, for example.

The light shield film 314 is formed in the scribe line region 312 similarly to the above description.

The main characteristic of the phase shift mask according to this embodiment lies in that the light shield film 314 is formed on the phase shifter film 302 only in the vicinity of the main wall part pattern 308 and the sub-wall part pattern 310 as described above.

In the phase shift mask according to the fourteenth embodiment, the light shield film 314 is formed all over the peripheral edge region 306. Since the resolution tends to be low in a region where the light shield film 314 is formed, microscopic contact holes cannot be formed inside the peripheral edge part when the phase shift mask according to the fourteenth embodiment is used. Accordingly, microscopic MOS transistors cannot be formed in the peripheral edge part when the phase shift mask according to the fourteenth embodiment is used.

In this embodiment, on the other hand, the light shield film 314 is selectively formed only in the vicinity of the main wall part pattern 308 and the sub-wall part pattern 310 in the peripheral edge region 306. Therefore, according to this embodiment, a high resolution is obtainable in the region of the peripheral edge region 306 where the light shield film 314 is not formed. Consequently, according to this embodiment, microscopic contact holes can be formed also in the peripheral edge part. Therefore, according to this embodiment, microscopic elements such as MOS transistors can be formed also in the peripheral edge part. According to this embodiment, it is possible to secure a wide space for a region in which microscopic elements such as MOS transistors can be formed, which can contribute to the reduction in chip size.

-Sixteenth Embodiment-

Figure 27A:
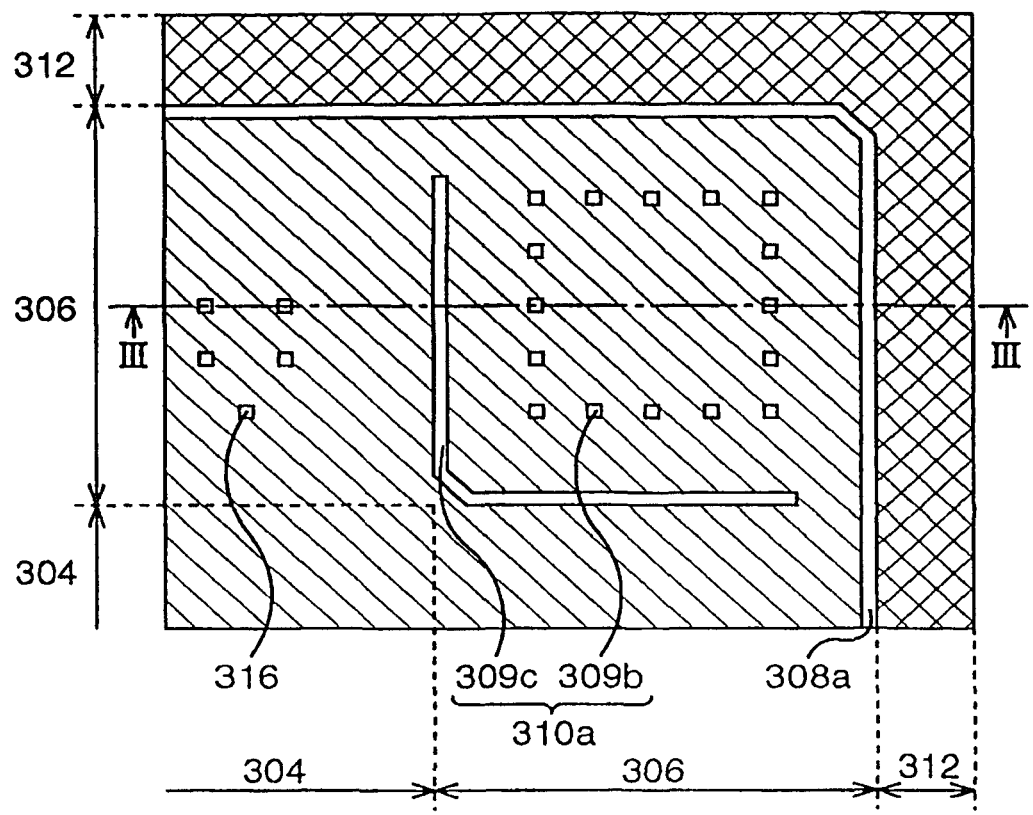
FIG. 27A and FIG. 27B are a plan view and a cross sectional view showing a phase shift mask according to a sixteenth embodiment of the present invention.
Figure 27B:
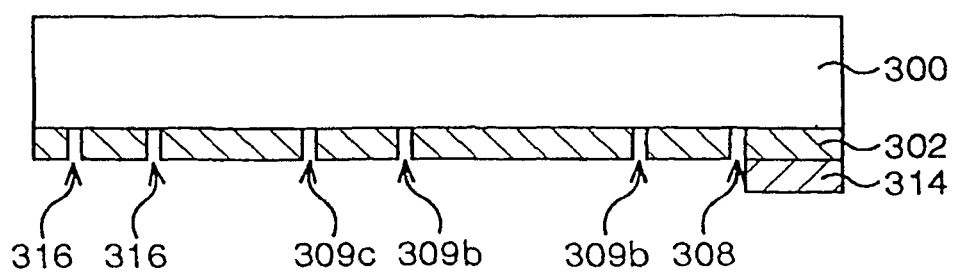

A phase shift mask according to a sixteenth embodiment of the present invention will be explained using FIG. 27A and FIG. 27B. FIG. 27A and FIG. 27B are a plan view and a cross sectional view showing the phase shift mask according to this embodiment. The same reference numerals and symbols are used to designate the same constituent elements as those of the semiconductor devices, the method of manufacturing the same, and the phase shift masks according to the first to fifteenth embodiments shown in FIG. 1 to FIG. 26B, and the explanation thereof will be omitted or simplified.

The main characteristics of the phase shift mask according to this embodiment lie in that the light shield film 314 is not formed in the peripheral edge region 306, that corner portions of the main wall part pattern 308a and a sub-wall part pattern 310a do not have a right angle but they have an obtuse angle, and that the main wall part pattern 308a and the sub-wall part pattern 310a are formed so as to be insolated from each other.

As shown in FIG. 27A and FIG. 27B, the light shield film 314 is not formed in the peripheral edge region 306 in this embodiment.

The corner portion of the main wall part pattern 308a does not have a right angle but has an obtuse angle. Concretely, the angle of the corner portion of the main wall part pattern 308a is 135 degrees.

The sub-wall part pattern 310a is constituted of a wall part piece pattern 309c and the wall part piece patterns 309b. The corner portion of the wall part piece pattern 309c does not have a right angle but has an obtuse angle. Concretely, the angle of the corner portion of the wall part piece pattern 309c is 135 degrees.

The reason why the corner portions of the main wall part pattern 308a and the sub-wall part pattern 310a do not have a right angle but has an obtuse angle in this embodiment is to eliminate portions having an L-shaped pattern to prevent the generation of the side lobe.

It should be noted that the angle of the corner portions of the main wall part pattern 308a and the sub-wall part pattern 310a, though being set to 135 degrees here, is not limited to 135 degrees. When the angle of the corner portions is obtuse, the generation of the side lobe can be reduced to some extent. Specifically, when the angle of the corner portions is 100 degrees or larger, the generation of the side lobe can be effectively reduced. When the angle of the corner portions is 110 degrees or larger, the generation of the side lobe can be more effectively reduced. Further, when the angle of the corner portions is 120 degrees or larger, the generation of the side lobe can be still more effectively reduced.

The main wall part pattern 308a and the sub-wall part pattern 310a are formed to be apart from each other.

The reason why the main wall part pattern 308a and the sub-wall part pattern 310a are formed to be apart from each other in this embodiment is to eliminate a portion having a T-shaped pattern to prevent the generation of the side lobe.

Thus, according to this embodiment, since the corner portions of the main wall part pattern 308a and the sub-wall part pattern 310a do not have a right angle but they have an obtuse angle, and in addition, the main wall part pattern 308a and the sub-wall part pattern 310a are formed to be apart from each other, the generation of the side lobe in the vicinity of the main wall part 2 and the side-wall part 3 can be prevented even when the light shield film 314 is not formed in the vicinity of the main wall part pattern 308a and the sub-wall part pattern 310a.

-Seventeenth Embodiment-

Figure 28A:
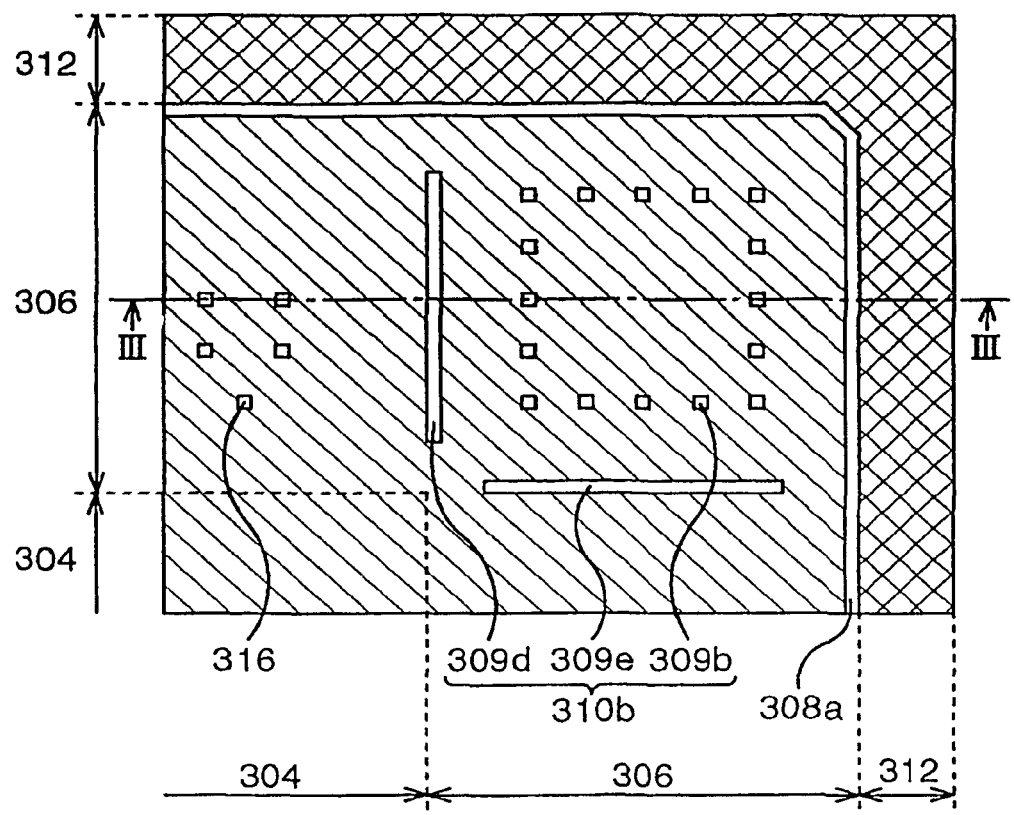
FIG. 28A and FIG. 28B are a plan view and a cross sectional view showing a phase shift mask according to a seventeenth embodiment of the present invention.
Figure 28B:
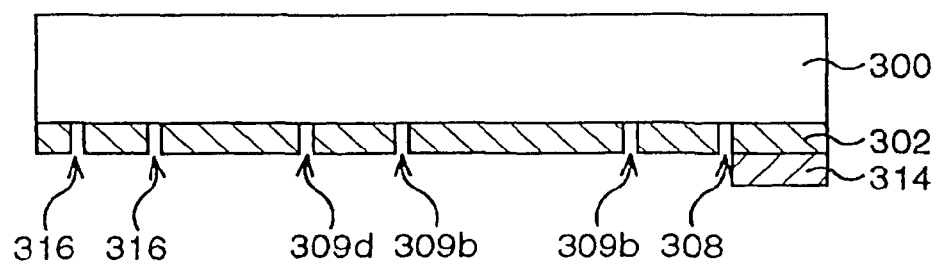

A phase shift mask according to a seventeenth embodiment of the present invention will be explained using FIG. 28A and FIG. 28B. FIG. 28A and FIG. 28B are a plan view and a cross sectional view showing the phase shift mask according to this embodiment. FIG. 28A is a plan view and FIG. 28B is a cross sectional view taken along the III-III line in FIG. 28A. The same reference numerals and symbols are used to designate the same constituent elements as those of the semiconductor devices, the method of manufacturing the same, and the phase shift masks according to the first to sixteenth embodiments shown in FIG. 1 to FIG. 27B, and the explanation thereof will be omitted or simplified.

The main characteristic of the phase shift mask according to this embodiment lies in that a sub-wall part pattern 310b is constituted of a plurality of wall part piece patterns 309b, 309d, 309e which are isolated from one another.

As shown in FIG. 28A and FIG. 28B, the sub-wall part pattern 310b is constituted of the plural wall part piece patterns 309b, 309d, 309e which are isolated from one another. Each of the wall part piece patterns 309d, 309e is formed in a linear shape.

The reason why the sub-wall part pattern 310b is thus formed in this embodiment is to effectively prevent the generation of the side lobe in a corner portion of the sub-wall part 310b.

Thus, according to this embodiment, since the sub-wall part pattern 310b is constituted of the plural wall part piece patterns 309b, 309d, 309e which are isolated from one another, the sub-wall part pattern 310b without any corner portion can be formed. Therefore, according to this embodiment, the generation of the side lobe can be prevented more effectively.

-Eighteenth Embodiment-

Figure 29A:
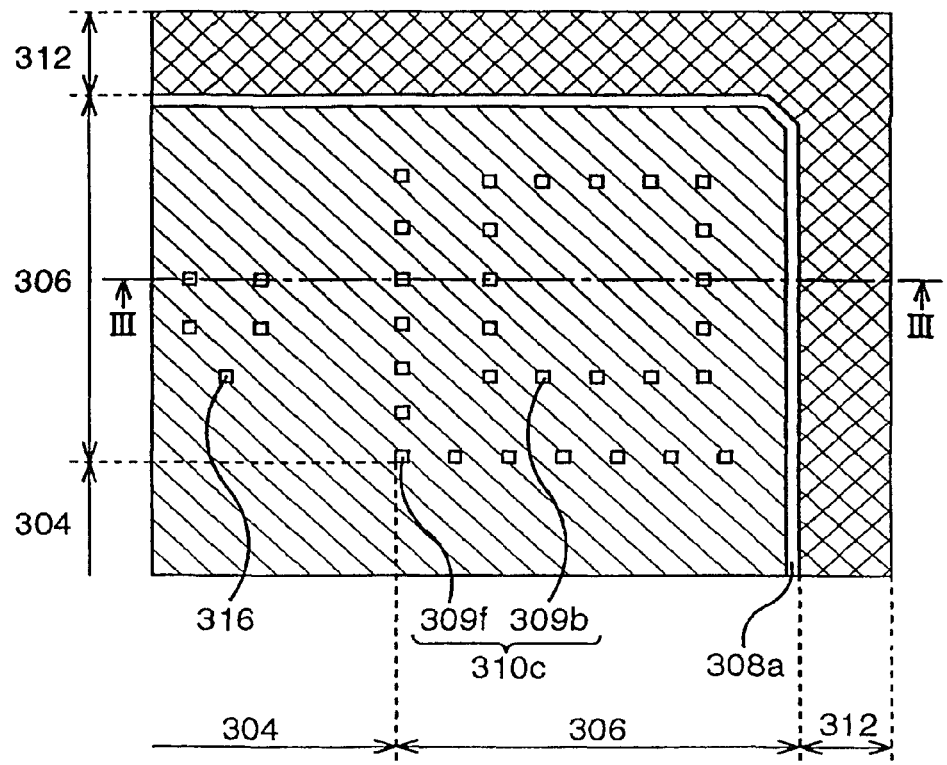
FIG. 29A and FIG. 29B are a plan view and a cross sectional view showing a phase shift mask according to an eighteenth embodiment of the present invention.
Figure 29B:
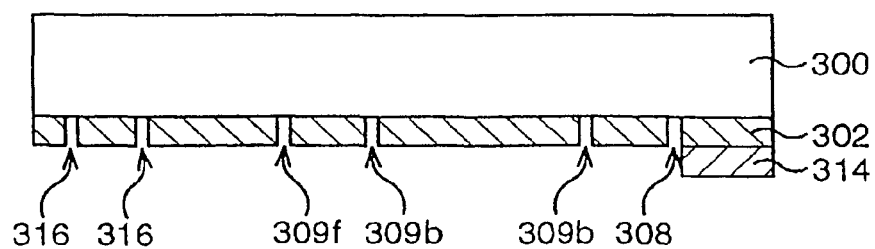

A phase shift mask according to an eighteenth embodiment of the present invention will be explained using FIG. 29A and FIG. 29B. FIG. 29A and FIG. 29B are a plan view and a cross sectional view showing the phase shift mask according to this embodiment. FIG. 29A is a plan view and FIG. 29B is a cross sectional view taken along the III-III line in FIG. 29A. The same reference numerals and symbols are used to designate the same constituent elements as those of the semiconductor devices, the method of manufacturing the same, and the phase shift masks according to the first to seventeenth embodiments shown in FIG. 1 to FIG. 28B, and the explanation thereof will be omitted or simplified.

The main characteristic of the phase shift mask according to this embodiment lies in that not only the wall part piece patterns 309b on the inner side but also wall part piece patterns 309f on the outer side are formed in a dot shape.

As shown in FIG. 29A and FIG. 29B, the sub-wall part pattern 310c is constituted of the dot-shaped wall part piece patterns 309f and the dot-shaped wall part piece patterns 309b. The plurality of wall part piece patterns 309f are formed. The wall part piece patterns 309f are arranged in an L shape as a whole. The wall part piece patterns 309b are arranged in a "square" shape as a whole similarly to the above description. The wall part piece patterns 309f have a shape approximate to that of the contact hole patterns 316 similarly to the wall part piece patterns 309b.

According to this embodiment, the generation of the side lobe can be also prevented since portions having an L-shaped pattern and a T-shaped pattern can be eliminated.

-Modification-

The present invention is not limited to the embodiments described above, and various modifications may be made.

For example, positions and the patterns of the comb-like electrodes which constitute the resistance value measuring part are not particularly limited. For example, they are arranged at positions sandwiching the sub-wall part between the main wall part and themselves, so as to surround the sub-wall part with the main wall part. Further, according to the present invention, the resistance value measuring part may not be necessarily provided. Moreover, it is possible to allow the sub-wall part to function as the resistance value measuring part. In this case, for example, the sub-wall part is formed so as to include a pair of electrodes, and pads for supplying signals from the outside may be provided to each of the pair of the electrodes. However, the metal films inside the sub-wall part which are electrically connected to the pads need to be electrically insulated from the substrate and the main wall part.

Furthermore, although the plan shape of the semiconductor device according to the present invention is not particularly limited, a polygon such as a quadrangle is favorable for the convenience of manufacturing. In this case, it is preferable that the sub-wall part is arranged between a vertex of the polygon and the integrated circuit part. This is because the stress is likely to concentrate at the vertex of the polygon.

Figure 21:
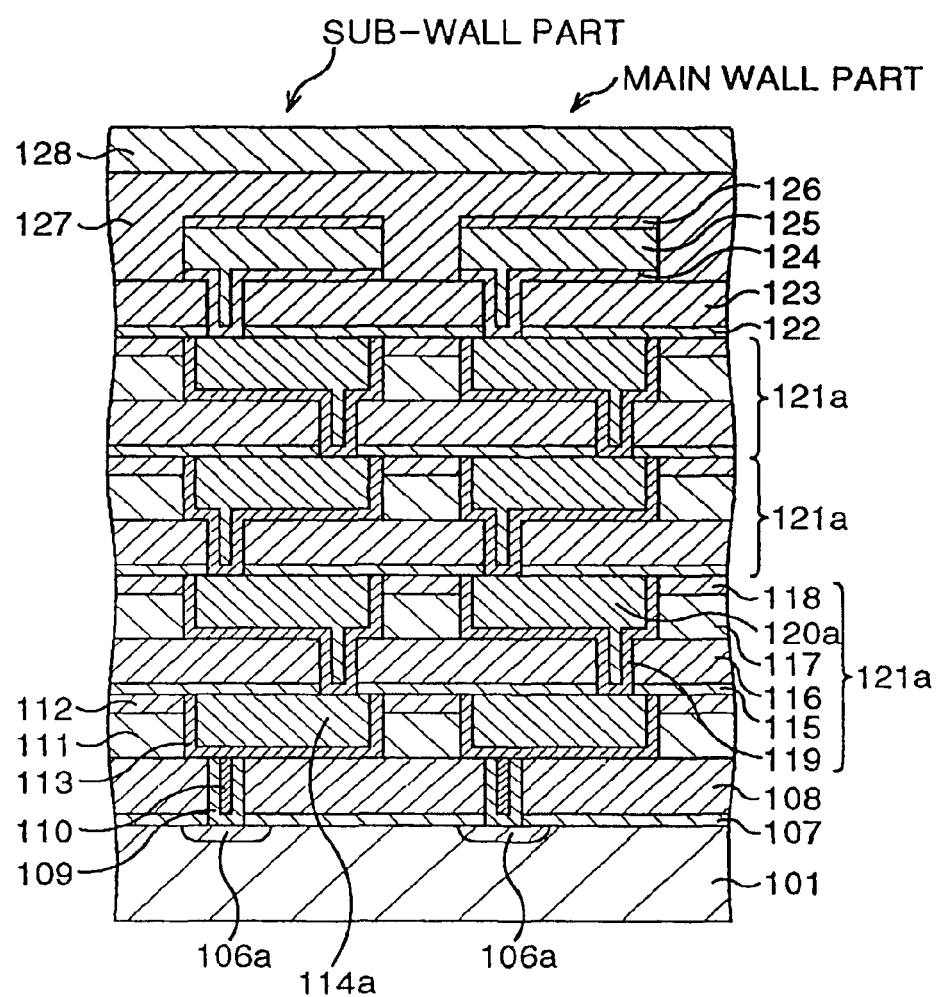
FIG. 21 is a sectional view showing one example of the structure of a main wall part 2 and a sub-wall part 3.

Further, as to the lamination structure of the main wall part and the sub-wall part according to the present invention, the wide trenches and the narrow trenches are not necessarily at the same positions in plan view. For example, as shown in FIG. 21, it may be structured so that the narrow trenches are alternately at the same positions in plan view.

Moreover, the above-described first to the thirteenth embodiments may be combined appropriately.

Figure 22:
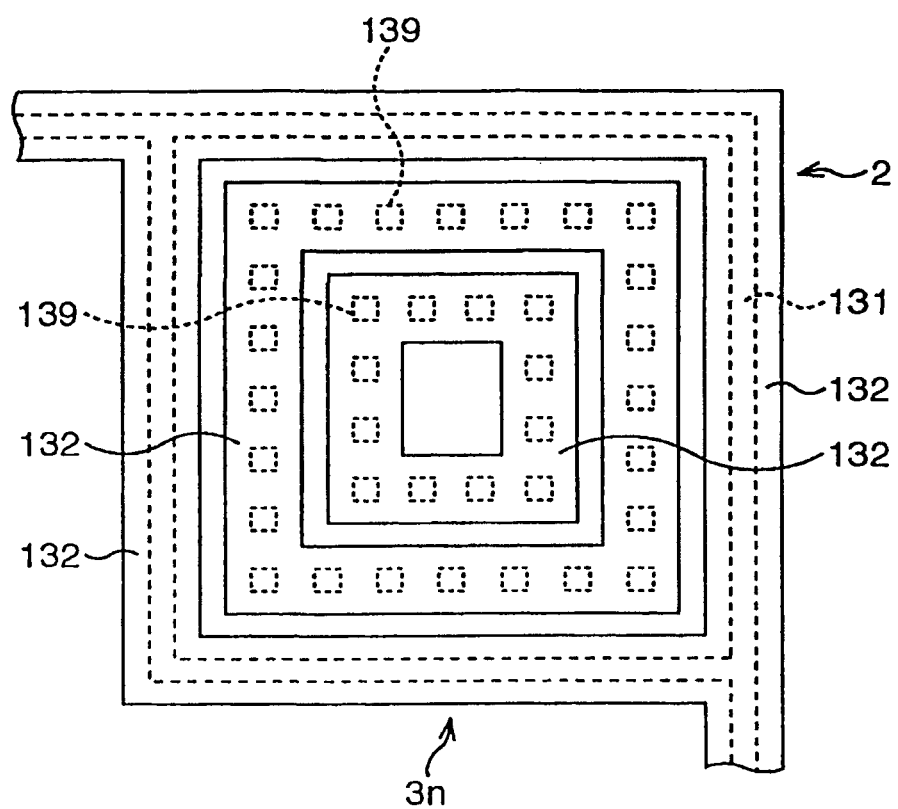
FIG. 22 is a layout showing the structure when replacement is applied to the twelfth embodiment shown in FIG. 16.

Furthermore, in the above-described first to the thirteenth embodiments, as shown in FIG. 22, a part of the trench 131 in a sub-wall part 3n may be replaced by contact holes 139 which are the same as the contact holes in the integrated circuit part 1. FIG. 22 is a layout showing the structure when the replacement is applied to the twelfth embodiment shown in FIG. 16.

Further, a part of the organic insulation films may be replaced by the Cu layer.

Moreover, in the embodiments described above, the light shield film is formed in the vicinity of both the main wall part pattern and the sub-wall part pattern, but the light shield film need not be always formed in the vicinity of both the main wall part pattern and the sub-wall part pattern. For example, the light shield film may be formed only in the vicinity of the main wall part pattern.

Further, in the embodiments described above, the light shield film is formed all over the vicinity of the main wall part pattern and the sub-wall part pattern, but the light shield film may be formed only in a part of the vicinity of the main wall part pattern and the sub-wall part pattern. In other words, the light shield film may be selectively formed only in a place where the side lobe is easily generated. For example, the light shield film may be selectively formed only in the vicinity of a place having an L-shaped pattern and a place having a T-shaped pattern.

Moreover, in the embodiments described above, the examples of preventing the side lobe generated in the vicinity of the main wall part and the sub-wall part are explained, but the present invention is applicable to the case where the side lobe generated in any place not limited to the vicinity of the main wall part and the sub-wall part is prevented. For example, the present invention is applicable to the case where the side lobe generation is prevented in the vicinity of a fuse pattern.

Further, in the embodiments described above, the wall part piece patterns 309b are formed in a dot shape, but the shape of the wall part piece patterns 309b is not limited to the dot shape and may be, for example, a linear shape.

As described above, according to the present invention, it is possible to make it difficult to cause the peeling between layers and the crack because the stress is easily dispersed near the region where the sub-wall part is provided. Therefore, it is possible to keep an entry ratio of moisture accompanied by the occurrence of the crack extremely low, and to ensure an extremely high moisture resistance. Further, it is possible to avoid the increase in the number of processes for forming such a structure. Furthermore, by connecting the main wall part and the sub-wall part to each other, it is possible to prevent the progress of the crack and the entry of moisture further.

Further, according to the present invention, since, in the phase shift mask, the light shield film is formed in the peripheral edge region in which the peripheral edge parts are to be formed, the light shield film can prevent lights from passing through the phase shifter film in the peripheral edge region. Consequently, according to the present invention, the mutual interference of the lights in the vicinity of the main wall part and the sub-wall part can be reduced to enable the prevention of the side lobe generation.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method of manufacturing a semiconductor device, comprising:
    forming a first interlayer insulation film above a semiconductor substrate which comprises a first edge region, an integrated circuit region surrounded by the first edge region and a second edge region located between the first edge region and a corner of the integrated circuit region;
    forming a contact hole in the first interlayer insulation film of the integrated circuit region, a first trench in the first interlayer insulation film of the first edge region and a second trench in the first interlayer insulation film of the second edge region;
    forming first metal films in the contact hole, the first trench and the second trench;
    forming a second interlayer insulation film above the first interlayer insulation film after forming the first metal films;
    forming a third trench wider than the first trench in the second interlayer insulation film of the first edge region and directly above the first trench, a fourth trench wider than the second trench in the second interlayer insulation film of the second edge region and directly above the second trench and a fifth trench in the second interlayer insulation film of the integrated circuit region and directly above the contact hole; and
    forming second metal films in the third trench, the fourth trench and the fifth trench,
    wherein the second trench bends at least one time in plan view,
    the first edge region comprises a main-wall part which comprises the first trench and the third trench, and
    the second edge region comprises a sub-wall part which comprises the second trench and the fourth trench.

2. The method of manufacturing the semiconductor device according to claim 1, wherein the third trench, the fourth trench and the fifth trench are formed simultaneously.

3. The method of manufacturing the semiconductor device according to claim 1, wherein a plan shape of the semiconductor device is substantially a polygon, and
    wherein said sub-wall part is formed between a vertex of said polygon and said integrated circuit region.

4. The method of manufacturing the semiconductor device according to claim 1, further comprising:
    forming a resistance value measuring part including:
    a pair of electrodes arranged in a region between said second edge region and said integrated circuit region; and
    pads for supplying signals from the outside to each of the pair of said electrodes.

5. The method of manufacturing the semiconductor device according to claim 1, wherein a part of said sub-wall part is connected to said main wall part.

6. A method of manufacturing a semiconductor device comprising:
    forming a first interlayer insulation film above a semiconductor substrate;
    forming a first trench in said first interlayer insulation film, said first trench surrounds an integrated part in which an integrated circuit is formed;
    forming a second trench in said first insulation film;
    forming first metal film in said first trench;
    forming second metal film in said second trench;
    forming a second interlayer insulation film above said first insulation film;
    forming a third trench in said second interlayer insulation film;

forming a fourth trench in said second interlayer insulation film;

forming a third metal film in said third trench, connected to said first metal film; and forming a fourth metal film in said fourth trench, connected to said second metal film, wherein said second trench is formed at an area of corner of a chip between said integrated circuit part and said first trench, incompletely surrounds said integrated part, and bends at least one time in plan view.

7. A method of manufacturing a semiconductor device comprising:

forming a first interlayer insulation film above a semiconductor substrate;

forming a first trench in said first interlayer insulation film, said first trench surrounds an integrated part in which an integrated circuit is formed;

forming a second trench in said first insulation film;

forming a first metal film in said first trench; and forming a second metal film in said second trench, wherein said second trench is formed at an area of corner of a chip between said integrated circuit part and said first trench, incompletely surrounds said integrated part, and bends at least one time in plan view.

8. A method of manufacturing a semiconductor device comprising:

forming a first interlayer insulation film above a semiconductor substrate;

forming a first opening in said first interlayer insulation film, said first opening surrounds an integrated part in which an integrated circuit is formed;

forming a second opening in said first insulation film;

forming a first metal films in said first opening; and forming a second metal films in said second opening, wherein said first opening and said second opening are formed by a dual damascene method, and said second opening is formed at an area of corner of a chip between said integrated circuit part and said first opening, incompletely surrounds said integrated part, and bends at least one time in plan view.

* * * * *

UNITED STATES PATENT AND TRADEMARK OFFICE
CERTIFICATE OF CORRECTION

| | | |
|---|---|---|
| PATENT NO. | : 8,507,377 B2 | Page 1 of 3 |
| APPLICATION NO. | : 12/764210 | |
| DATED | : August 13, 2013 | |
| INVENTOR(S) | : Kenichi Watanabe et al. | |

It is certified that error appears in the above-identified patent and that said Letters Patent is hereby corrected as shown below:

In the Claims

Column 24, Line 59

Change

"integrated part"

To Be

--integrated circuit part--

Column 24, Line 61

Change

"first insulation"

To Be

--first interlayer insulation--

Column 24, Line 62

Change

"forming first"

To Be

--forming a first--

Signed and Sealed this
Twenty-eighth Day of April, 2015

Michelle K. Lee
*Director of the United States Patent and Trademark Office*

CERTIFICATE OF CORRECTION (continued)
U.S. Pat. No. 8,507,377 B2

Column 24, Line 63

Change

"forming second"

To Be

--forming a second--

Column 24, Line 65

Change

"insulation film"

To Be

--interlayer insulation film--

Column 25, Line 9

Change

"integrated part"

To Be

--integrated circuit part--

Column 25, Line 17

Change

"integrated part"

To Be

--integrated circuit part--

Column 25, Line 19

Change

"first insulation"

To Be

--first interlayer insulation--

Column 26, Line 3

Change

"integrated part"

To Be

--integrated circuit part--

Column 26, Line 10

Change

"integrated part"

To Be

--integrated circuit part--

Column 26, Line 12

Change

"first insulation"

To Be

--first interlayer insulation--

Column 26, Line 19

Change

"integrated part"

To Be

--integrated circuit part--